(12) United States Patent
Wang et al.

(10) Patent No.: US 11,495,178 B2
(45) Date of Patent: Nov. 8, 2022

(54) PIXEL CIRCUIT HAVING A PLURALITY OF ENABLE SIGNALS AND GATE SIGNALS IN OPPOSITE PHASE AND DRIVING METHOD THEREOF

(71) Applicant: BOE TECHNOLOGY GROUP CO., LTD., Beijing (CN)

(72) Inventors: Zhichong Wang, Beijing (CN); Fuqiang Li, Beijing (CN); Peng Liu, Beijing (CN); Xinglong Luan, Beijing (CN); Jing Feng, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/243,915

(22) Filed: Apr. 29, 2021

(65) Prior Publication Data

US 2021/0343242 A1 Nov. 4, 2021

(30) Foreign Application Priority Data

Apr. 30, 2020 (CN) .......................... 202010368045.X

(51) Int. Cl.
*G09G 3/3258* (2016.01)
*G09G 3/3291* (2016.01)
*H01L 27/32* (2006.01)

(52) U.S. Cl.
CPC ......... *G09G 3/3258* (2013.01); *G09G 3/3291* (2013.01); *H01L 27/3218* (2013.01); *G09G 2310/0286* (2013.01)

(58) Field of Classification Search
CPC ................................................. G09G 3/3258
(Continued)

(56) References Cited

U.S. PATENT DOCUMENTS

2015/0130859 A1* 5/2015 Yang ..................... G09G 3/3233
                                                              345/690
2017/0092200 A1* 3/2017 Park ...................... G09G 3/3233
(Continued)

FOREIGN PATENT DOCUMENTS

CN 104966489 10/2015
CN 107154239 9/2017
(Continued)

OTHER PUBLICATIONS

Chinese First Office Action (w/ English translation) for corresponding CN Application No. 202010368045.X, 18 pages.
(Continued)

*Primary Examiner* — Long D Pham
(74) *Attorney, Agent, or Firm* — Dority & Manning, P.A.

(57) ABSTRACT

A pixel circuit includes a data writing sub-circuit, a light-emitting control sub-circuit and a driving sub-circuit. The data writing sub-circuit is connected to the driving sub-circuit, and is configured to write a data voltage signal into the driving sub-circuit and compensate it, in response to a first gate signal and a second gate signal. The light-emitting control sub-circuit is connected to the driving sub-circuit, and is configured to close a line between a first power supply voltage terminal and a second power supply voltage terminal, in response to a first enable signal and a second enable signal. The driving sub-circuit is configured to provide a driving current to a light-emitting device through the closed line according to the written data voltage signal. Phases of the first enable signal and the first gate signal are opposite, and phases of the second enable signal and the second gate signal are opposite.

17 Claims, 14 Drawing Sheets

(58) Field of Classification Search
USPC .......................................................... 345/204
See application file for complete search history.

(56) References Cited

U.S. PATENT DOCUMENTS

| | | | |
|---|---|---|---|
| 2017/0270853 A1* | 9/2017 | Xiang | .................. G09G 3/3275 |
| 2017/0270867 A1 | 9/2017 | Zhu et al. | |
| 2017/0301293 A1 | 10/2017 | Zhu et al. | |
| 2018/0151115 A1* | 5/2018 | Tseng | ................... G09G 3/3266 |
| 2019/0096327 A1 | 3/2019 | Peng et al. | |
| 2020/0090594 A1 | 3/2020 | Zou et al. | |
| 2020/0388217 A1 | 12/2020 | Yuan et al. | |
| 2021/0097938 A1 | 4/2021 | Wu et al. | |
| 2021/0166630 A1 | 6/2021 | Kim et al. | |
| 2021/0201806 A1 | 7/2021 | Feng et al. | |
| 2021/0217364 A1 | 7/2021 | Wang | |
| 2021/0225293 A1 | 7/2021 | Wang | |

FOREIGN PATENT DOCUMENTS

| | | |
|---|---|---|
| CN | 207337880 | 5/2018 |
| CN | 207489447 | 6/2018 |
| CN | 108806601 | 11/2018 |
| CN | 109712565 | 5/2019 |
| CN | 110010058 | 7/2019 |
| JP | 2016057539 | 4/2016 |

OTHER PUBLICATIONS

Chinese Second Office Action (w/ English translation) for corresponding CN Application No. 202010368045.X, 17 pages.
Chinese Notification to Grant Patent Right for Invention (w/ English translation) for corresponding CN Application No. 202010368045.X, 7 pages.

* cited by examiner

PIXEL CIRCUIT HAVING A PLURALITY OF ENABLE SIGNALS AND GATE SIGNALS IN OPPOSITE PHASE AND DRIVING METHOD THEREOF

This application claims priority to Chinese Patent Application No. 202010368045.X, filed Apr. 30, 2020, which is incorporated herein by reference in its entirety.

TECHNICAL FIELD

The present disclosure relates to display technologies, and in particular, to a pixel circuit and a driving method thereof, and a display apparatus.

BACKGROUND

At present, OLED (Organic Light-emitting Diode) display apparatuses are increasingly widely used due to their advantages of self-luminescence, wide viewing angle, high response speed, low power consumption and the like.

An OLED display apparatus includes a plurality of sub-pixels, and each sub-pixel includes a pixel circuit. With the development of display technologies, there are more and more requirements for functions of the pixel circuit, such as functions of compensating a threshold voltage, compensating the mobility of carriers, reducing an afterimage, and alleviating aging of a device.

SUMMARY

In one aspect, a pixel circuit is provided. The pixel circuit includes a data writing sub-circuit, a light-emitting control sub-circuit and a driving sub-circuit. The data writing sub-circuit is electrically connected to the driving sub-circuit; and the data writing sub-circuit is configured to write a data voltage signal from a data voltage signal terminal into the driving sub-circuit and compensate the data voltage signal, in response to a first gate signal from a first gate signal terminal and a second gate signal from a first gate signal terminal. The light-emitting control sub-circuit is electrically connected to the driving sub-circuit; and the light-emitting control sub-circuit is configured to close a line between a first power supply voltage terminal and a second power supply voltage terminal, in response to a first enable signal from a first enable signal terminal and a second enable signal from a second enable signal terminal. The driving sub-circuit is configured to provide a driving current to a light-emitting device through the closed line between the first power supply voltage terminal and the second power supply voltage terminal according to the written data voltage signal. Phases of the first enable signal and the first gate signal are opposite, and phases of the second enable signal and the second gate signal are opposite.

In some embodiments, the data writing sub-circuit includes a first transistor, a second transistor, a third transistor and a fourth transistor. A gate of the first transistor is electrically connected to the second gate signal terminal, and a first electrode of the first transistor is electrically connected to the data voltage signal terminal. A gate of the second transistor is electrically connected to the first gate signal terminal, a first electrode of the second transistor is electrically connected to a second electrode of the first transistor, and a second electrode of the second transistor is electrically connected to the driving sub-circuit. A gate of the third transistor is electrically connected to the second gate signal terminal, and a first electrode of the third transistor is electrically connected to the driving sub-circuit. A gate of the fourth transistor is electrically connected to the first gate signal terminal, a first electrode of the fourth transistor is electrically connected to a second electrode of the third transistor, and a second electrode of the fourth transistor is electrically connected to the driving sub-circuit.

In some embodiments, the pixel circuit further includes a first reset sub-circuit. The first reset sub-circuit is electrically connected to the data writing sub-circuit; and the first reset sub-circuit is configured to transmit a reset voltage signal from a reset signal terminal to the driving sub-circuit through the data writing sub-circuit, in response to the second enable signal or a third gate signal from a third gate signal terminal, so as to reset the driving sub-circuit.

In some embodiments, the first reset sub-circuit includes a fifth transistor. A gate of the fifth transistor is electrically connected to the second enable signal terminal or the third gate signal terminal, a first electrode of the fifth transistor is electrically connected to the reset signal terminal, and a second electrode of the fifth transistor is electrically connected to the second electrode of the third transistor and the first electrode of the fourth transistor.

In some embodiments, the light-emitting control sub-circuit includes a seventh transistor and an eighth transistor. A gate of the seventh transistor is electrically connected to the second enable signal terminal, a first electrode of the seventh transistor is electrically connected to the first power supply voltage terminal, and a second electrode of the seventh transistor is electrically connected to the driving sub-circuit. A gate of the eighth transistor is electrically connected to the first enable signal terminal, a first electrode of the eighth transistor is electrically connected to the driving sub-circuit, and a second electrode of the eighth transistor is electrically connected to the light-emitting device.

In some embodiments, the pixel circuit further includes a second reset sub-circuit. The second reset sub-circuit is electrically connected to the light-emitting device; and the second reset sub-circuit is configured to transmit a reset voltage signal from a reset signal terminal to the light-emitting device in response to the first gate signal, so as to reset the light-emitting device.

In some embodiments, the second reset sub-circuit includes a sixth transistor. A gate of the sixth transistor is electrically connected to the first gate signal terminal, a first electrode of the sixth transistor is electrically connected to the reset signal terminal, and a second electrode of the sixth transistor is electrically connected to the light-emitting device.

In some embodiments, the driving circuit includes a driving transistor and a first capacitor. A first electrode of the driving transistor is electrically connected to the data writing sub-circuit and the light-emitting control sub-circuit, and a second electrode of the driving transistor is electrically connected to the light-emitting control sub-circuit. A first terminal of the first capacitor is electrically connected to the first power supply voltage terminal, and a second terminal of the first capacitor is electrically connected to a gate of the driving transistor and the data writing sub-circuit.

In some embodiments, the pixel circuit further includes a first reset sub-circuit and a second reset sub-circuit. The first reset sub-circuit is electrically connected to the data writing sub-circuit, the first reset sub-circuit is configured to transmit a reset voltage signal from a reset signal terminal to the driving sub-circuit through the data writing sub-circuit, in response to the second enable signal or a third gate signal from a third gate signal terminal, so as to reset the driving sub-circuit. The second reset sub-circuit is electrically connected to the light-emitting device, the second reset sub-circuit is configured to transmit the reset voltage signal from the reset signal terminal to the light-emitting device in response to the first gate signal, so as to reset the light-emitting device. The data writing sub-circuit includes a first transistor, a second transistor, a third transistor and a fourth transistor, the first reset sub-circuit includes a fifth transistor, the second reset sub-circuit includes a sixth transistor, the light-emitting control sub-circuit includes a seventh transistor and an eighth transistor, and the driving sub-circuit includes a driving transistor and a first capacitor. A gate of the first transistor is electrically connected to the second gate signal terminal, a first electrode of the first transistor is electrically connected to the data voltage signal terminal, and a second electrode of the first transistor is electrically connected to a first electrode of the second transistor. A gate of the second transistor is electrically connected to the first gate signal terminal, and a second electrode of the second transistor is electrically connected to a first electrode of the driving transistor. A gate of the third transistor is electrically connected to the second gate signal terminal, a first electrode of the third transistor is electrically connected to a second electrode of the driving transistor, and a second electrode of the third transistor is electrically connected to a first electrode of the fourth transistor. A gate of the fourth transistor is electrically connected to the first gate signal terminal, a first electrode of the fourth transistor is further electrically connected to a second electrode of the fifth transistor, and a second electrode of the fourth transistor is electrically connected to a gate of the driving transistor and a second terminal of the first capacitor. The gate of the driving transistor is further electrically connected to the second terminal of the first capacitor, the first electrode of the driving transistor is further electrically connected to a second electrode of the seventh transistor, and the second terminal of the driving transistor is further electrically connected to a first electrode of the eighth transistor. A first terminal of the first capacitor is electrically connected to the first power supply voltage terminal. A gate of the fifth transistor is electrically connected to the second enable signal terminal or the third gate signal terminal, and a first electrode of the fifth transistor is electrically connected to the reset signal terminal. A gate of the sixth transistor is electrically connected to the first gate signal terminal, a first electrode of the sixth transistor is electrically connected to the reset signal terminal, and a second electrode of the sixth transistor is electrically connected to the light-emitting device. A gate of the seventh transistor is electrically connected to the second enable signal terminal, and a first electrode of the seventh transistor is electrically connected to the first power supply voltage terminal. A gate of the eighth transistor is electrically connected to the first enable signal terminal, and a second electrode of the eighth transistor is electrically connected to the light-emitting device.

In another aspect, agate driver circuit is provided. The gate driver circuit includes a first cascade group and a second cascade group. The first cascade group includes a plurality of first shift registers connected in cascade, and the second cascade group includes a plurality of second shift registers connected in cascade. The plurality of first shift registers and the plurality of second shift registers are alternately arranged in a first direction, and each shift register includes a first output terminal and a second output terminal. Each first shift register is configured to: output a first output signal through a first output terminal thereof and a second output signal through a second output terminal thereof, in response to a first clock signal and a second clock signal. Each second shift register is configured to output a third output signal through a first output terminal thereof and a fourth output signal through a second output terminal thereof, in response to a third clock signal and a fourth clock signal. Phases of the first clock signal and the second clock signal are opposite, and phases of the third clock signal and the fourth clock signal are opposite; and phases of the first output signal and the second output signal are opposite, and phases of the third output signal and the fourth output signal are opposite.

In some embodiments, the first output signal and the third output signal have a phase difference therebetween, the first output signal has a first level period and a second level period in sequence within one cycle, and a duration corresponding to the phase difference is less than a duration of the first level period.

In some embodiments, each shift register further includes an input terminal, a first clock signal receiving terminal and a second clock signal receiving terminal. Each of at least one shift register of the plurality of first shift registers and the plurality of second shift registers further includes a first output sub-circuit. The first output sub-circuit is electrically connected to a third power supply voltage terminal, a fourth power supply voltage terminal, a corresponding input terminal, a corresponding first clock signal receiving terminal, a corresponding second clock signal receiving terminal, a corresponding first output terminal, and a corresponding second output terminal, and the first output sub-circuit includes an eleventh transistor to a seventeenth transistor, a second capacitor and a third capacitor. A gate of the eleventh transistor is electrically connected to the corresponding first clock signal receiving terminal, a first electrode of the eleventh transistor is electrically connected to the corresponding input terminal, and a second electrode of the eleventh transistor is electrically connected to a gate of the twelfth transistor, a gate of the fifteenth transistor, and a first terminal of the second capacitor. A first electrode of the twelfth transistor is electrically connected to the corresponding first clock signal receiving terminal, and a second electrode of the twelfth transistor is electrically connected to the corresponding second output terminal, a gate of the sixteenth transistor, a gate of the fourteenth transistor, and a first terminal of the third capacitor. A gate of the thirteenth transistor is electrically connected to the corresponding first clock signal receiving terminal, a first electrode of the thirteenth transistor is electrically connected to the fourth power supply voltage terminal, and a second electrode of the thirteenth transistor is electrically connected to the corresponding second output terminal, the gate of the sixteenth transistor, the gate of the fourteenth transistor, and the first terminal of the third capacitor. The gate of the fourteenth transistor is further electrically connected to the first terminal of the third capacitor, a first electrode of the fourteenth transistor is electrically connected to the third power supply voltage terminal, and a second electrode of the fourteenth transistor is electrically connected to a second terminal of the second capacitor, and the corresponding first output terminal. The gate of the fifteenth transistor is further electrically connected to the first terminal of the second capacitor and a second electrode of the seventeenth transistor, a first electrode of the fifteenth transistor is electrically connected to the corresponding second clock signal receiving terminal, and a second electrode of the fifteenth transistor is electrically connected to the second terminal of the second capacitor, and the corresponding first output terminal. The gate of the sixteenth transistor is further electrically connected to the first terminal of the third capacitor, a first electrode of the sixteenth transistor is electrically connected to the third power supply voltage terminal, and a second electrode of the sixteenth transistor is electrically connected to a first electrode of the seventeenth transistor. A gate of the seventeenth transistor is electrically connected to the corresponding second clock signal receiving terminal, and the second electrode of the seventeenth transistor is further electrically connected to the first terminal of the second capacitor. The second terminal of the second capacitor is further electrically connected to the corresponding first output terminal. A second terminal of the third capacitor is electrically connected to the third power supply voltage terminal.

In some embodiments, each shift register further includes an input terminal, a first clock signal receiving terminal and a second clock signal receiving terminal. Each of at least one shift register of the plurality of first shift registers and the plurality of second shift registers further includes a first output sub-circuit, and a second output sub-circuit electrically connected to the first output sub-circuit. The first output sub-circuit is electrically connected to a third power supply voltage terminal, a fourth power supply voltage terminal, a corresponding input terminal, a corresponding first clock signal receiving terminal, a corresponding second clock signal receiving terminal, and a corresponding first output terminal; and the first output sub-circuit including an eleventh transistor to a seventeenth transistor, a second capacitor and a third capacitor. The second output sub-circuit is further electrically connected to the third power supply voltage terminal, the fourth power supply voltage terminal, the corresponding first clock signal receiving terminal, the corresponding second clock signal receiving terminal, and a corresponding second output terminal; and the second output sub-circuit including an eighteenth transistor to a twenty-first transistor and a fourth capacitor. A gate of the eleventh transistor is electrically connected to the corresponding first clock signal receiving terminal, a first electrode of the eleventh transistor is electrically connected to the corresponding input terminal, and a second electrode of the eleventh transistor is electrically connected to a gate of the twelfth transistor, a gate of the fifteenth transistor, and a first terminal of the second capacitor. A first electrode of the twelfth transistor is electrically connected to the corresponding first clock signal receiving terminal, and a second electrode of the twelfth transistor is electrically connected to a gate of the sixteenth transistor, a gate of the fourteenth transistor, and a first terminal of the third capacitor. A gate of the thirteenth transistor is electrically connected to the corresponding first clock signal receiving terminal, a first electrode of the thirteenth transistor is electrically connected to the fourth power supply voltage terminal, and a second electrode of the thirteenth transistor is electrically connected to the gate of the sixteenth transistor, the gate of the fourteenth transistor, and the first terminal of the third capacitor. The gate of the fourteenth transistor is electrically connected to the first terminal of the third capacitor, a first electrode of the fourteenth transistor is electrically connected to the third power supply voltage terminal, and a second electrode of the fourteenth transistor is electrically connected to a second terminal of the second capacitor, the corresponding first output terminal, a gate of the eighteenth transistor, and a gate of the twentieth transistor. The gate of the fifteenth transistor is further electrically connected to the first terminal of the second capacitor and a second electrode of the seventeenth transistor, a first electrode of the fifteenth transistor is electrically connected to the corresponding second clock signal receiving terminal, and a second electrode of the fifteenth transistor is electrically connected to the second terminal of the second capacitor, the corresponding first output terminal, the gate of the eighteenth transistor, and the gate of the twentieth transistor. The gate of the sixteenth transistor is further electrically connected to the first terminal of the third capacitor, a first electrode of the sixteenth transistor is electrically connected to the third power supply voltage terminal, and a second electrode of the sixteenth transistor is electrically connected to a first electrode of the seventeenth transistor. A gate of the seventeenth transistor is electrically connected to the corresponding second clock signal receiving terminal, and the second electrode of the seventeenth transistor is further electrically connected to the first terminal of the second capacitor. A first electrode of the eighteenth transistor is electrically connected to the third power supply voltage terminal, and a second electrode of the eighteenth transistor is electrically connected to a gate of the twenty-first transistor and a first terminal of the fourth capacitor. A gate of the nineteenth transistor is electrically connected to the first clock signal receiving terminal, a first electrode of the nineteenth transistor is electrically connected to the fourth power supply voltage terminal, and a second electrode of the nineteenth transistor is electrically connected to the gate of the twenty-first transistor and the first terminal of the fourth capacitor. A first electrode of the twentieth transistor is electrically connected to the third power supply voltage terminal, and a second electrode of the twentieth transistor is electrically connected to the corresponding second output terminal. The gate of the twenty-first transistor is further electrically connected to the first terminal of the fourth capacitor, a first electrode of the twenty-first transistor is electrically connected to the fourth power supply voltage terminal, and a second electrode of the twenty-first transistor is electrically connected to the corresponding second output terminal. A second terminal of the fourth capacitor is electrically connected to the second clock signal receiving terminal.

In yet another aspect, a display panel is provided. The display panel has a sub-pixel array, and the sub-pixel array includes a plurality of sub-pixels arranged in an array. The display panel includes a plurality of pixel circuits described above and at least one gate driver circuit described above. Each pixel circuit is disposed in a respective one of the plurality of sub-pixels. The first direction is substantially parallel to a column direction of the sub-pixel array, each gate driver circuit is electrically connected to a plurality of sub-pixel rows in the sub-pixel array, and each shift register in the gate driver circuit is electrically connected to a corresponding sub-pixel row of the plurality of sub-pixel rows. A pixel circuit of each sub-pixel in the corresponding sub-pixel row is configured to: receive a first output signal output by a first shift register corresponding to the corresponding sub-pixel row as a first gate signal, and a second output signal output thereby as a first enable signal; and receive a third output signal output by a second shift register corresponding to a next sub-pixel row of the corresponding sub-pixel row as a second gate signal, and a fourth output signal output thereby as a second enable signal; or receive a third output signal output by a second shift register corresponding to the corresponding sub-pixel row as the first gate signal, and a fourth output signal output thereby as the first enable signal; and receive a first output signal output by a first shift register corresponding to a next sub-pixel row of the corresponding sub-pixel row as the second gate signal, and a second output signal output thereby as the second enable signal.

In some embodiments, the pixel circuit further includes a first reset sub-circuit. The first reset sub-circuit is electrically connected to the data writing sub-circuit, and the first reset sub-circuit is configured to: transmit a reset voltage signal from a reset signal terminal to a corresponding driving sub-circuit through the corresponding data writing sub-circuit, in response to a third gate signal from a corresponding third gate signal terminal, so as to reset the corresponding driving sub-circuit. The pixel circuit is further configured to: receive a third output signal output by a second shift register corresponding to a previous sub-pixel row of the corresponding sub-pixel row as the third gate signal; or receive a first output signal output by a first shift register corresponding to the previous sub-pixel row of the corresponding sub-pixel row as the third gate signal.

In yet another aspect, a driving method of the above pixel circuit is provided. Each pixel circuit has a second phase and a third phase in an image frame. The driving method includes: in the second phase, writing, by the data writing sub-circuit, the data voltage signal from the data voltage terminal into the driving sub-circuit and compensating, by the data writing sub-circuit, the data voltage signal, in response to the first gate signal and the second gate signal; and in the third phase, closing, by the light-emitting control sub-circuit, the line between the first power supply voltage terminal and the second power supply voltage terminal in response to the first enable signal and the second enable signal; and providing, by the driving sub-circuit, the driving current to the light-emitting device through the closed line between the first power supply voltage terminal and the second power supply voltage terminal according to the written data voltage signal; wherein the phases of the first enable signal and the first gate signal are opposite, and the phases of the second gate signal and the second enable signal are opposite.

In some embodiments, the first enable signal and the second enable signal have a phase difference therebetween, the first enable signal has a third level period and a fourth level period in sequence within one cycle, and a duration corresponding to the phase difference is less than a duration of the third level period of the first enable signal.

In some embodiments, the pixel circuit further includes a first reset sub-circuit electrically connected to the data writing sub-circuit. The image frame further includes a first phase before the second phase. The driving method further includes: in the first phase, transmitting, by the first reset sub-circuit, a reset voltage signal from a reset signal terminal to the driving sub-circuit through the data writing sub-circuit, in response to the second enable signal or a third gate signal from a third gate signal terminal, so as to reset the driving sub-circuit.

In some embodiments, the pixel circuit further includes a second reset sub-circuit electrically connected to the corresponding light-emitting device. The image frame further includes a first phase before the second phase. The driving method further includes: in the first phase, transmitting, by the second reset sub-circuit, a reset voltage signal from a reset signal terminal to the light-emitting device, in response to the first gate signal, so as to reset the light-emitting device.

BRIEF DESCRIPTION OF THE DRAWINGS

In order to describe technical solutions in the present disclosure more clearly, accompanying drawings to be used in some embodiments of the present disclosure will be introduced briefly. However, the accompanying drawings to be described below are merely accompanying drawings of some embodiments of the present disclosure, and a person of ordinary skill in the art may obtain other drawings according to these drawings.

In addition, the accompanying drawings to be described below may be regarded as schematic diagrams, and are not limitations on actual sizes of products, an actual process of a method and actual timings of signals to which the embodiments of the present disclosure relate.

DETAILED DESCRIPTION

Technical solutions in some embodiments of the present disclosure will be described clearly and completely with reference to the accompanying drawings below. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to." In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, features defined as "first" and "second" may explicitly or implicitly include one or more of the features. In the description of the embodiments of the present disclosure, the term "a plurality of" means two or more unless otherwise specified.

In the description of some embodiments, the term "electrically connected" and its extensions may be used, which may indicate that two or more components are in direct electric contact, or that two or more components are in indirect electric contact through other component(s).

The term "about", "approximately" or "substantially" as used herein includes a stated value and an average value within an acceptable range of deviation of a particular value determined by a person of ordinary skill in the art, considering measurement in question and errors associated with measurement of a particular quantity (i.e., limitations of a measurement system).

Figure 1:
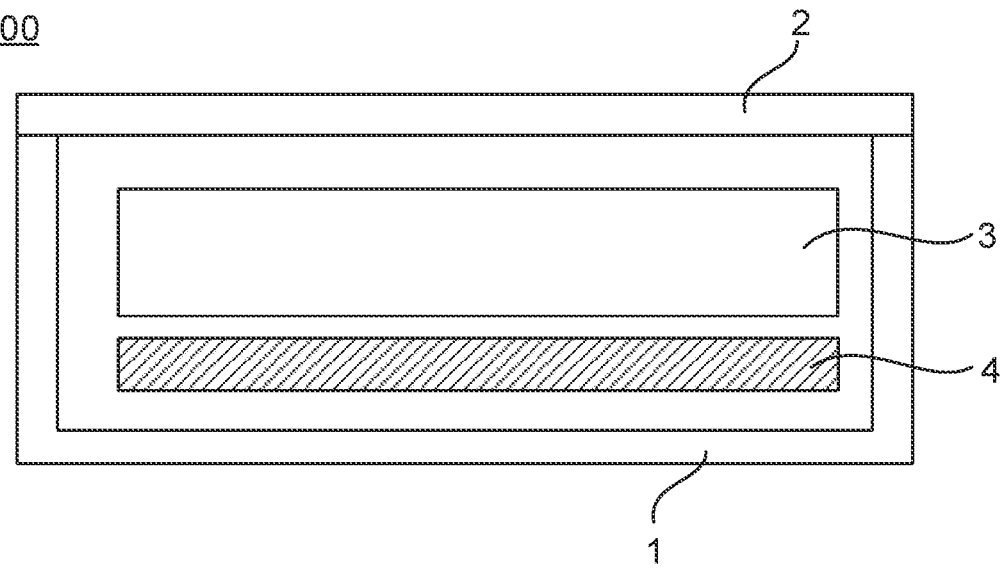
FIG. 1 is a schematic diagram illustrating a structure of a display apparatus, in accordance with some embodiments.

Some embodiments of the present disclosure provide a display apparatus. As shown in FIG. 1, the display apparatus 100 includes a frame 1, a cover plate 2, a display panel 3, and some other electronic accessories such as a circuit board 4.

The frame 1 has a U-shaped section, the display panel 3 and the other electronic accessories such as the circuit board 4 are disposed in the frame 1, the circuit board 4 may be disposed on a side of the display panel 3 away from a display surface thereof, and the cover plate 2 is disposed on a side of the display panel 3 away from the circuit board 4.

The display apparatus 100 may be an organic light-emitting diode (OLED) display apparatus, or a quantum dot light-emitting diode (QLED) display apparatus.

Figure 2A:
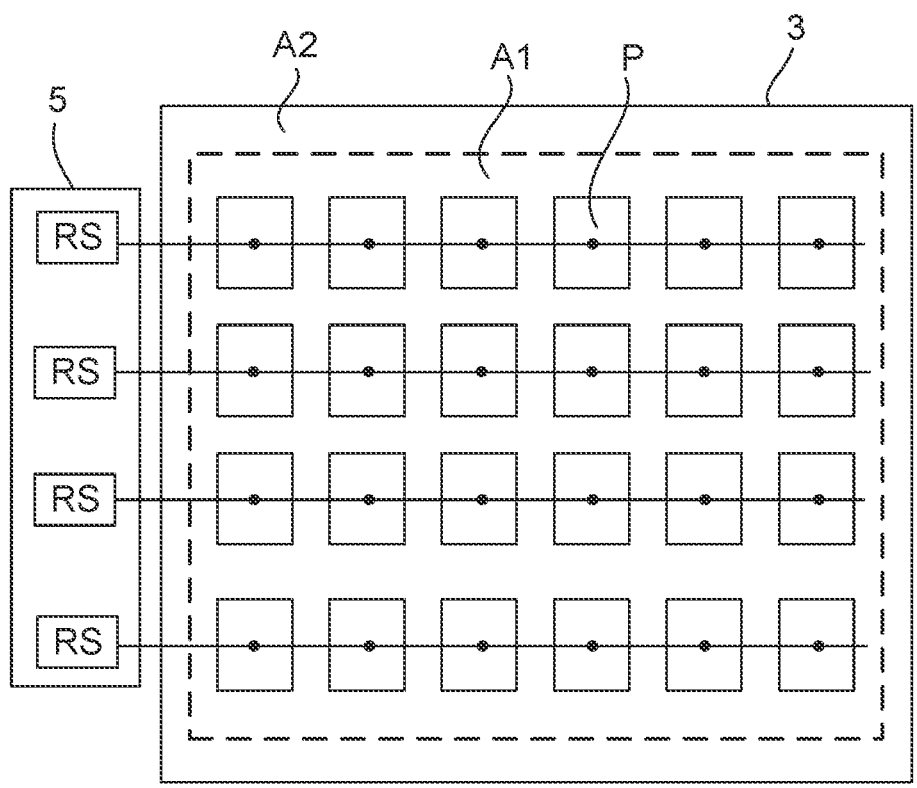
FIG. 2A is a schematic diagram illustrating a display panel connecting a gate driver circuit, in accordance with some embodiments.
Figure 2B:
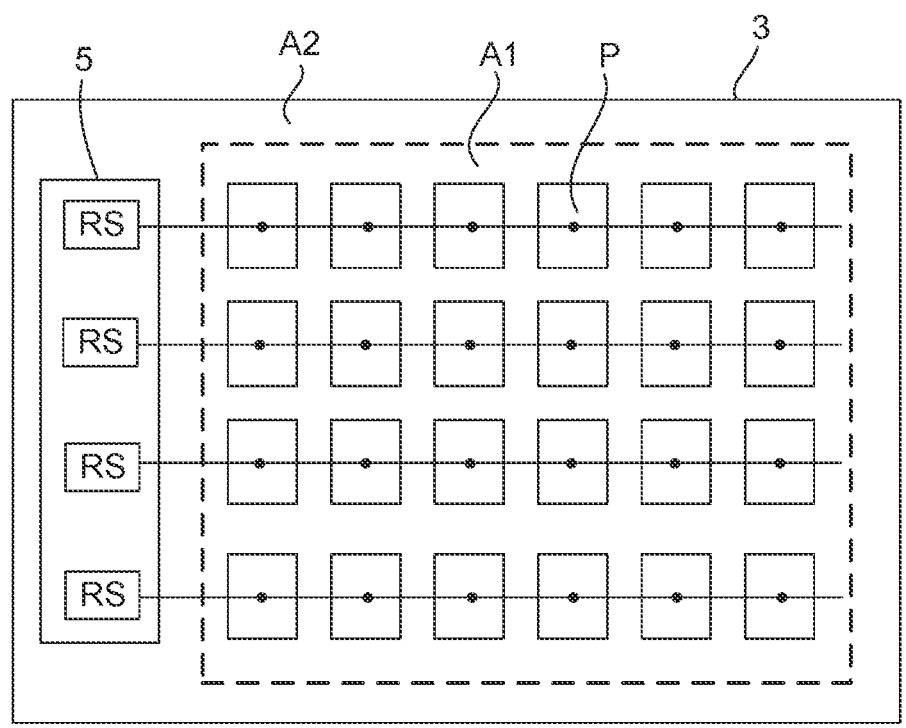
FIG. 2B is a schematic diagram illustrating a display panel, in accordance with some embodiments.

As shown in FIGS. 2A and 2B, the display panel 3 includes a display area A1, and a peripheral area A2 located on at least one side of the display area A1. FIGS. 2A and 2B show an example in which the peripheral area A2 surrounds the display area A1. The display panel 3 has a plurality of sub-pixels P arranged in the display area A1, and these sub-pixels P may be arranged in an array. The display panel 3 includes a pixel circuit disposed in each sub-pixel P, and the pixel circuit is used for driving a light-emitting device in the sub-pixel P to emit light. The peripheral area S may be used for arranging wires.

For example, referring to FIG. 2B, the display panel 3 further includes at least one gate driver circuit 5 disposed in the peripheral area A2, that is, the gate driver circuit 5 may be disposed in the display panel 3.

As another example, referring to FIG. 2A, the gate driver circuit 5 is disposed outside the display panel 3, that is, they are individually disposed.

It will be noted that, the number of gate driver circuits 5 included in the display apparatus 100 is related to the number of sub-pixel rows included in the display panel 3. The number of sub-pixel rows that may be driven by one gate driver circuit 5 is constant. Therefore, in a case where the number of the sub-pixel rows included in the display panel 3 is large, the number of gate driver circuits 5 arranged may be large, whereas in a case where the number of the sub-pixel rows included in the display panel 3 is small, the number of gate driver circuits 5 arranged may be small.

In some embodiments, as shown in FIGS. 2A and 2B, the gate driver circuit 5 includes a plurality of shift registers RS. Herein, taking an example in which each shift register RS corresponds to one sub-pixel row, the shift register RS is electrically connected to each sub-pixel P in the sub-pixel row to provide row scanning signals (e.g., enable signals and gate signals) for these sub-pixels P. In addition, the plurality of shift registers RS are connected in cascade, so that progressive scanning of a plurality of corresponding sub-pixel rows may be achieved.

Figure 3:
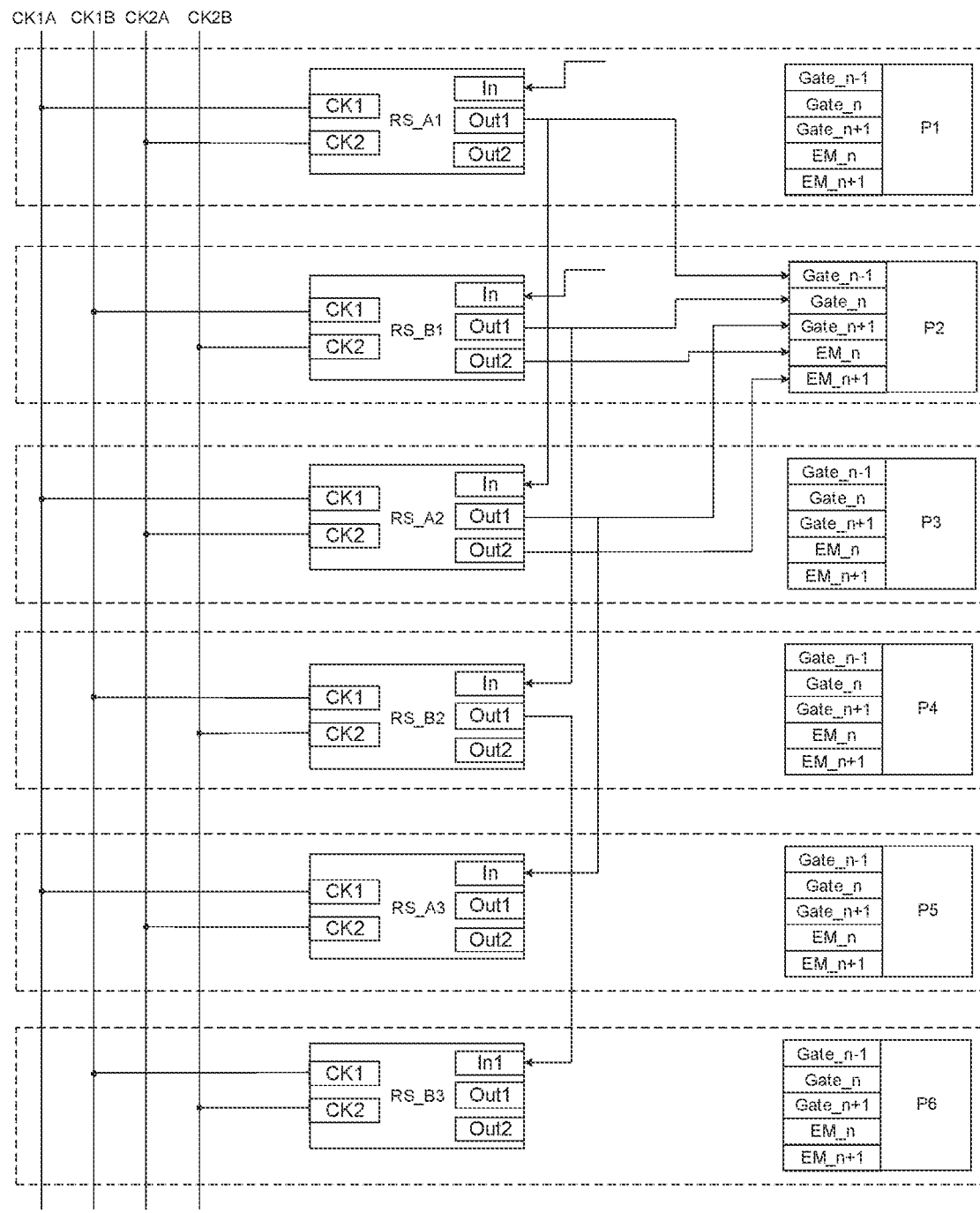
FIG. 3 is a schematic diagram illustrating a structure of a gate driver circuit, in accordance with some embodiments.

In some embodiments, referring to FIG. 3, the gate driver circuit 5 includes a first cascade group and a second cascade group. The first cascade group includes a plurality of first shift registers RS_A connected in cascade, and the second cascade group includes a plurality of second shift registers RS_B connected in cascade. The plurality of first shift registers RS_A and the plurality of second shift registers RS_B are alternately arranged in a first direction. Herein, each shift register RS includes a first output terminal Out1 and a second output terminal Out2. For example, the first direction is substantially parallel to a column direction of the sub-pixel array.

Each first shift register RS_A is configured to: output a first output signal V1 through a first output terminal Out1 thereof and output a second output signal V2 through a second output terminal Out2 thereof, in response to a first clock signal CKA1 and a second clock signal CKA2. Each second shift register RS_B is configured to: output a third output signal V3 through a first output terminal Out1 thereof and output a fourth output signal V4 through a second output terminal Out2 thereof, in response to a third clock signal CKB1 and a fourth clock signal CKB2.

Figure 4:
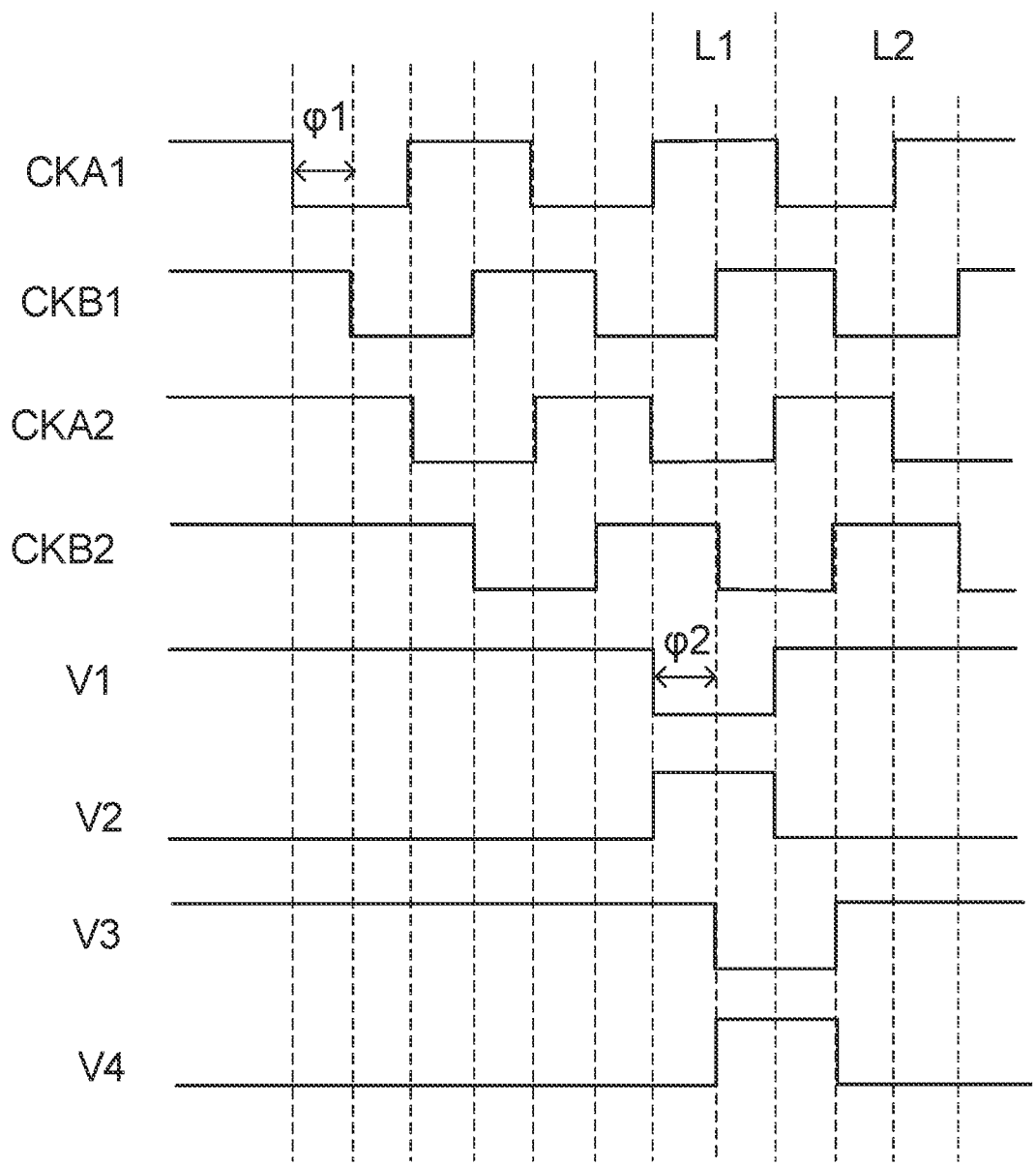
FIG. 4 is a signal timing diagram of a gate driver circuit, in accordance with some embodiments.

Referring to FIG. 4, phases of the first clock signal CKA1 and the second clock signal CKA2 are opposite, and phases of the third clock signal CKB1 and the fourth clock signal CKB2 are opposite. Phases of the first output signal V1 and the second output signal V2 are opposite, and phases of the third output signal V3 and the fourth output signal V4 are opposite.

It will be noted that, waveforms of the first clock signal CKA1 and the third clock signal CKB1 are the same, and there is a phase difference $\varphi 1$ between the two clock signals.

For example, referring to FIG. 4, waveforms of the first output signal V1 and the third output signal V3 are the same, and there is a phase difference $\varphi 2$ between the two output signals. The first output signal V1 includes a first level period L1 and a second level period L2 in sequence within one cycle, and a duration corresponding to the phase difference $\varphi 2$ is less than a duration of the first level period L1. Take an example in which the first level period L1 is a low level period, and the second level period L2 is a high level period, referring to FIG. 4, the duration corresponding to the phase difference $\varphi 2$ is less than the duration of the low level period of the first output signal V1.

In addition, the phase difference $\varphi 1$ between the first clock signal CKA1 and the third clock signal CKB1 may be equal to the phase difference $\varphi 2$ between the first output signal V1 and the third output signal V3.

The first shift register RS_A and the second shift register RS_B each includes a first output terminal Out1 and a second output terminal Out2. The first shift register RS_A may receive the first clock signal CK1A through a first clock signal receiving terminal CK1 thereof and receive the second clock signal CK2A through a second dock signal receiving terminal CK2 thereof. The second shift register RS_B may receive the third clock signal CK1B through a first clock signal receiving terminal CK1 thereof and receive the fourth clock signal CK2B through a second clock signal receiving terminal CK2 thereof. Herein, the phases of the first clock signal CK1A and the second clock signal CK2A are opposite, and the phases of the third clock signal CK1B and the fourth clock signal CK2B are opposite.

The first shift register RS_A is configured to output the first output signal V1 to a corresponding sub-pixel row through the first output terminal Out1 thereof and output the second output signal V2 to a corresponding sub-pixel row through the second output terminal Out2 thereof, in response to the received first clock signal CK1A and the second clock signal CK2A. The second shift register RS_B is configured to output the third output signal V3 to a corresponding sub-pixel row through the first output terminal Out1 thereof and output the fourth output signal V4 to a corresponding sub-pixel row through the second output terminal Out2 thereof, in response to the received third clock signal CK1B and the fourth clock signal CK2B.

Circuit structures of the first shift register RS_A and the second shift register RS_B will be exemplarily described below with reference to FIGS. 3, 5A and 5B. Each shift register further includes an input terminal In, a first clock signal receiving terminal CK1 and a second clock signal receiving terminal CK2.

It will be noted that, the first shift register RS_A and the second shift register RS_B may have the same circuit structure or different circuit structures. A description will be given below by taking the first shift register RS_A as an example. For the circuit structure of the second shift register RS_B, reference may be made to the circuit structure of the first shift register RS_A.

Figure 5A:
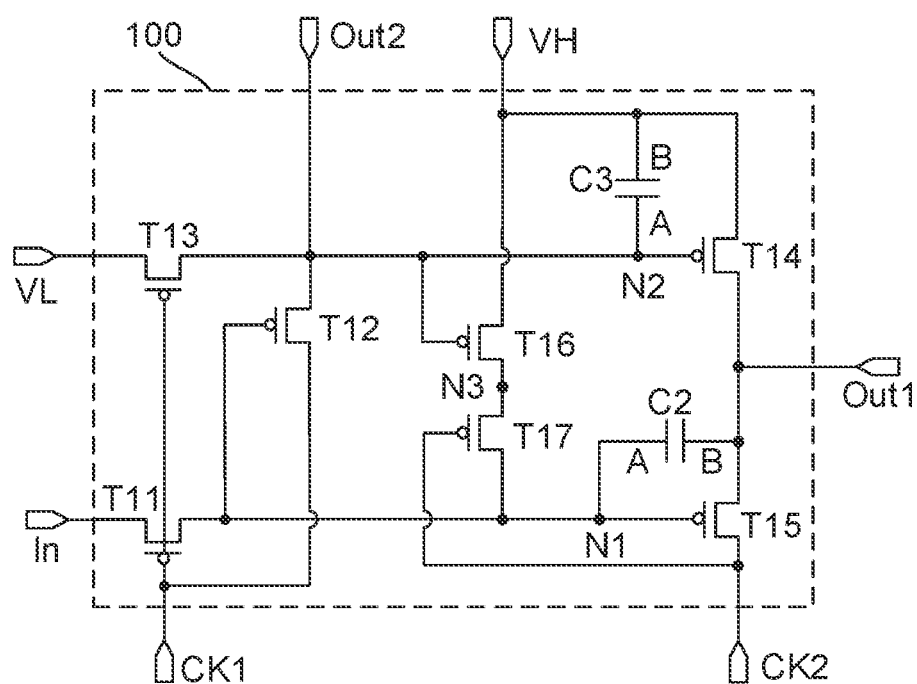
FIG. 5A is a schematic diagram of a shift register.

In some embodiments, referring to FIGS. 3 and 5A, the first shift register RS_A further includes a first output sub-circuit 100. The first output sub-circuit 100 is electrically connected to a third power supply voltage terminal VH, a fourth power supply voltage terminal VL, and the input terminal In, the first clock signal receiving terminal CK1, the second clock signal receiving terminal CK2, the first output terminal Out1 and the second output terminal Out2 of the first shift register RS_A. It will be noted that, voltage signals provided by the third power supply voltage terminal VH and the fourth power supply voltage terminal VL herein and hereinafter are voltage signals with substantially constant voltage values.

The first output sub-circuit 100 is configured to transmit the first output signal V1 to the first output terminal Out1 and transmit the second output signal V2 opposite in phase to the first output signal V1 to the second output terminal Out 2, in response to an input signal Vin from the input terminal In, the first clock signal CKA1 from the first clock signal receiving terminal CK1, and the second clock signal CKA2 from the second clock signal receiving terminal CK2.

For example, referring to FIG. 5A, the first output sub-circuit 100 includes an eleventh transistor T11 to a seventeenth transistor T17, a second capacitor C2 and a third capacitor C3.

A gate of the eleventh transistor T11 is electrically connected to the corresponding first clock signal receiving terminal CK1, a first electrode of the eleventh transistor T11 is electrically connected to the corresponding input terminal In, and a second electrode of the eleventh transistor T11 is electrically connected to a gate of the twelfth transistor T12, a gate of the fifteenth transistor T15, and a first terminal A of the second capacitor C2.

A first electrode of the twelfth transistor T12 is electrically connected to the corresponding first clock signal receiving terminal CK1, and a second electrode of the twelfth transistor T12 is electrically connected to the corresponding second output terminal Out2, a gate of the sixteenth transistor T16, a gate of the fourteenth transistor T14, and a first terminal A of the third capacitor C3.

A gate of the thirteenth transistor T13 is electrically connected to the corresponding first clock signal receiving terminal CK1, a first electrode of the thirteenth transistor T13 is electrically connected to the fourth power supply voltage terminal VL, and a second electrode of the thirteenth transistor T13 is electrically connected to the corresponding second output terminal Out2, the gate of the sixteenth transistor T16, the gate of the fourteenth transistor T14, and the first terminal A of the third capacitor C3.

The gate of the fourteenth transistor T14 is further electrically connected to the first terminal A of the third capacitor C3, a first electrode of the fourteenth transistor T14 is electrically connected to the third power supply voltage terminal VH, and a second electrode of the fourteenth transistor T14 is electrically connected to a second terminal B of the second capacitor C2 and the corresponding first output terminal Out1.

The gate of the fifteenth transistor T15 is further electrically connected to the first terminal A of the second capacitor C2 and a second electrode of the seventeenth transistor T17, and a first electrode of the fifteenth transistor T15 is electrically connected to the corresponding second clock signal receiving terminal CK2.

The gate of the sixteenth transistor T16 is further electrically connected to the first terminal A of the third capacitor C3, a first electrode of the sixteenth transistor T16 is electrically connected to the third power supply voltage terminal VH, and a second electrode of the sixteenth transistor T16 is electrically connected to a first electrode of the seventeenth transistor T17.

A gate of the seventeenth transistor T17 is electrically connected to the corresponding second clock signal receiving terminal CK2, and the second electrode of the seventeenth transistor T17 is further electrically connected to the first terminal A of the second capacitor C2.

The second terminal B of the second capacitor C2 is further electrically connected to the corresponding first output terminal Out1. The second terminal B of the third capacitor C3 is electrically connected to the third power supply voltage terminal VH.

Figure 5B:
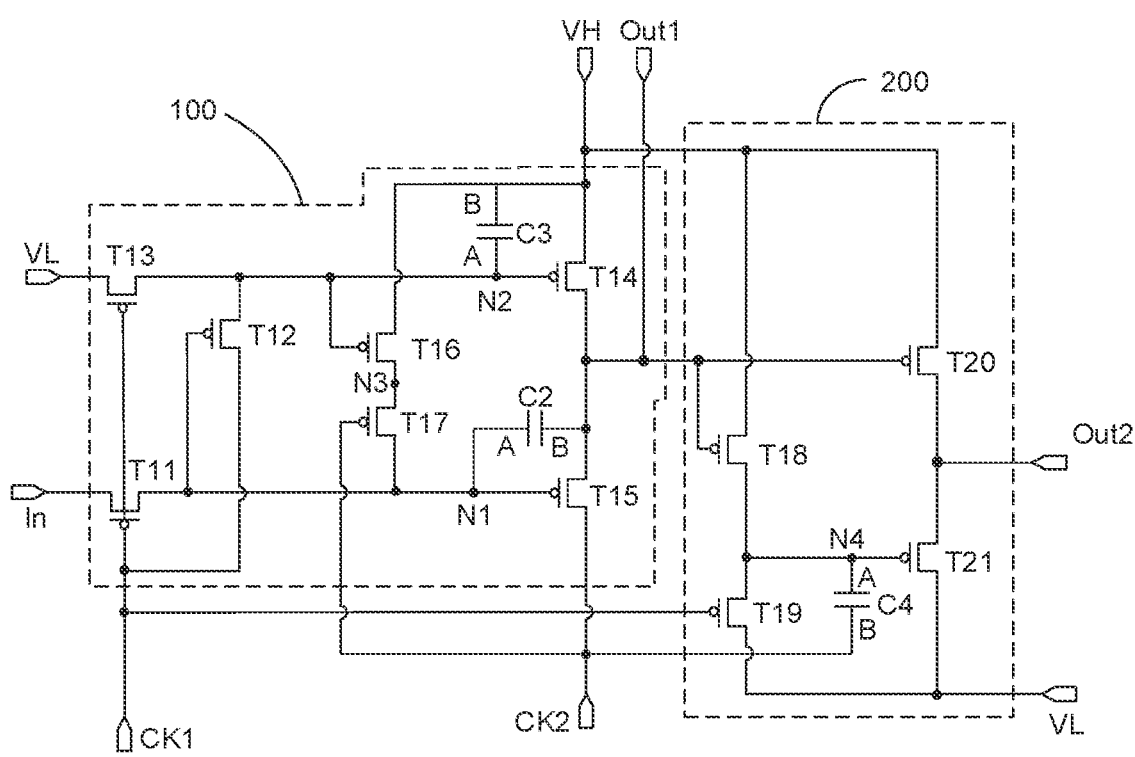
FIG. 5B is a schematic diagram of another shift register.

In some other embodiments, as shown in FIGS. 3 and 5B, the first shift register RS_A further includes a first output sub-circuit 100 and a second output sub-circuit 200 that are electrically connected.

The first output sub-circuit 100 is electrically connected to the third power supply voltage terminal VH, the fourth power supply voltage terminal VL, the corresponding input terminal In, the corresponding first clock signal receiving terminal CK1, the corresponding second clock signal receiving terminal CK2, and the corresponding first output terminal Out1. The first output sub-circuit 100 is configured to transmit the first output signal V1 to the first output terminal Out1 and the second output sub-circuit 200, in response to the input signal Vin from the input terminal In, the first clock signal CKA1 from the first clock signal receiving terminal CK1, and the second clock signal CKA2 from the second clock signal receiving terminal CK2.

The second output sub-circuit 200 is further electrically connected to the third power supply voltage terminal VH, the fourth power supply voltage terminal VL, the corresponding first clock signal receiving terminal CK1, the corresponding second clock signal receiving terminal CK2, and the corresponding second output terminal Out2. The second output sub-circuit 200 is configured to transmit the second output signal V2 opposite in phase to the first output signal V1 to the second output terminal Out2, in response to the first output signal V1 transmitted by the first output sub-circuit 100.

For example, referring to FIG. 5B, the first output sub-circuit 100 includes a eleventh transistor T11 to a seventeenth transistor T17, a second capacitor C2 and a third capacitor C3, and the second output sub-circuit 200 includes an eighteenth transistor T18 to a twenty-first transistor T21 and a fourth capacitor C4.

A gate of the eleventh transistor T11 is electrically connected to the corresponding first clock signal receiving terminal CK1, a first electrode of the eleventh transistor T11 is electrically connected to the corresponding input terminal In, and a second electrode of the eleventh transistor T11 is electrically connected to a gate of the twelfth transistor, a gate of the fifteenth transistor, and a first terminal of the second capacitor C2.

A first electrode of the twelfth transistor T12 is electrically connected to the corresponding first clock signal receiving terminal CK1, and a second electrode of the twelfth transistor T12 is electrically connected to a gate of the sixteenth transistor T16, a gate of the fourteenth transistor T14, and a first terminal A of the third capacitor C3.

A gate of the thirteenth transistor T13 is electrically connected to the corresponding first clock signal receiving terminal CK1, a first electrode of the thirteenth transistor T13 is electrically connected to the fourth power supply voltage terminal VL, and a second electrode of the thirteenth transistor T13 is electrically connected to the gate of the sixteenth transistor T16, the gate of the fourteenth transistor T14, and the first terminal A of the third capacitor C3.

The gate of the fourteenth transistor T14 is electrically connected to the first terminal A of the third capacitor C3, the first electrode of the fourteenth transistor T14 is electrically connected to the third power supply voltage terminal VH, and a second electrode of the fourteenth transistor T14 is electrically connected to a second terminal B of the second capacitor C2, the corresponding first output terminal Out1, a gate of the eighteenth transistor T18, and a gate of the twentieth transistor T20.

A gate of the fifteenth transistor T15 is electrically connected to a first terminal A of the second capacitor C2 and a second electrode of the seventeenth transistor T17, a first electrode of the fifteenth transistor T15 is electrically connected to the corresponding second clock signal receiving terminal CK2, and a second electrode of the fifteenth transistor T15 is electrically connected to a second terminal of the second capacitor C2, the corresponding first output terminal Out1, the gate of the eighteenth transistor T18, and the gate of the twentieth transistor T20.

The gate of the sixteenth transistor T16 is further electrically connected to the first terminal A of the third capacitor C3, a first electrode of the sixteenth transistor T16 is electrically connected to the third power supply voltage terminal VH, and a second electrode of the sixteenth transistor T16 is electrically connected to a first electrode of the seventeenth transistor T17.

A gate of the seventeenth transistor T17 is electrically connected to the corresponding second clock signal receiving terminal CK2, and a second electrode of the seventeenth transistor T17 is electrically connected to the first terminal A of the second capacitor C2.

A first electrode of the eighteenth transistor T18 is electrically connected to the third power supply voltage terminal VH, and a second electrode of the eighteenth transistor T18 is electrically connected to a gate of the twenty-first transistor T21 and a first terminal A of the fourth capacitor C4.

A gate of the nineteenth transistor T19 is electrically connected to the first clock signal receiving terminal CK1, a first electrode of the nineteenth transistor T19 is electrically connected to the fourth power supply voltage terminal VL, and a second electrode of the nineteenth transistor T19 is electrically connected to the gate of the twenty-first transistor T21 and the first terminal A of the fourth capacitor C4.

A first electrode of the twentieth transistor T20 is electrically connected to the third power supply voltage terminal VH, and a second electrode of the twentieth transistor T20 is electrically connected to the second output terminal Out2.

The gate of the twenty-first transistor T21 is further electrically connected to the first terminal A of the fourth capacitor C4, a first electrode of the twenty-first transistor T21 is electrically connected to the fourth power supply voltage terminal VL, and a second electrode of the twenty-first transistor T21 is electrically connected to the second output terminal Out2.

A second terminal B of the fourth capacitor C4 is electrically connected to the second clock signal receiving terminal CK2.

Figure 6:
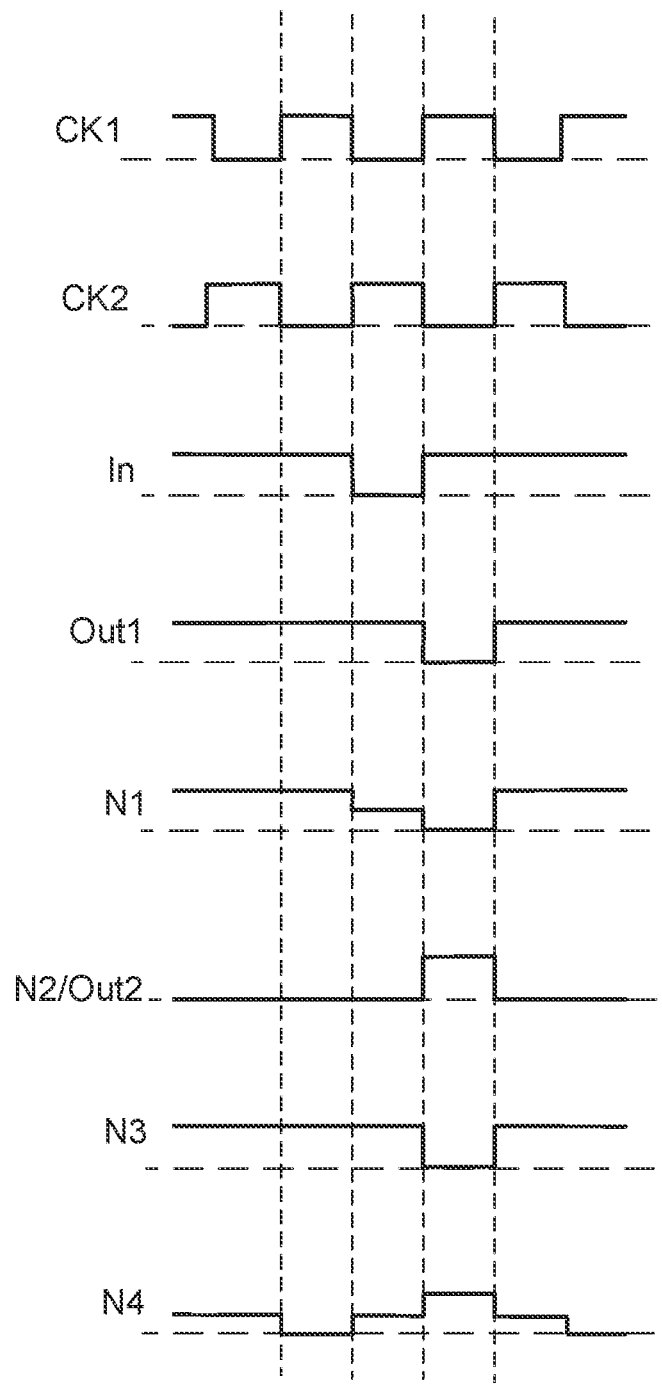
FIG. 6 is a signal timing diagram of a shift register, in accordance with some embodiments.

For example, timings of signals of the shift register RS are shown in FIG. 6. Referring to FIGS. 5A and 5B, the shift register RS includes: a first nod N1 between the first terminal A of the second capacitor C2 and the gate of the fifteenth transistor T15, a second nod N2 between the first terminal A of the third capacitor C3 and the gate of the fourteenth transistor T14, and a third nod N3 between the second electrode of the sixteenth transistor T16 and the first electrode of the seventeenth transistor T17. In a case where the shift register RS with the circuit shown in FIG. 5B is used, the shift register RS further includes a fourth nod N4 between the first terminal A of the fourth capacitor C4 and the gate of the twentieth transistor T20. Voltages of the above nods are also shown in FIG. 6.

It will be noted that, the first output signal V1 and second output signal V2 are transmitted to sub-pixels in a corresponding sub-pixel row. For example, referring to FIG. 3, a first shift register RS_A1 may output a first output signal V1 to sub-pixels P1 in a corresponding sub-pixel row through a first output terminal Out1 thereof, and may output a second output signal V2 to the sub-pixels P1 through a second output terminal Out2 thereof.

Similar to the first output signal V1 and the second output signal V2, the third output signal V3 and the fourth output signal V4 output by the second shift register RS_B are also transmitted to sub-pixels P in a corresponding sub-pixel row. For example, referring to FIG. 3, a second shift register RS_B1 may output a third output signal V3 to sub-pixels P2 in a corresponding sub-pixel row through a first output terminal Out1 thereof, and may output a fourth output signal V4 to the sub-pixels P2 through a second output terminal Out2 thereof.

It will also be noted that, referring to FIG. 3, in two shift registers RS connected in cascade, an output signal of one shift register RS may be used as an input signal Vin of the other shift register RS. Taking the first shift register RS_A1 and a first shift register RS_A2 connected in cascade in FIG. 3 as an example, the first output signal V1 output through the first output terminal Out1 of the first shift register RS_A1 is input through an input terminal In of the first shift register RS_A2 as an input signal Vin.

An exemplary description will be given below with reference to FIG. 3 by taking an example in which the gate driver circuit 5 includes six shift registers. The first cascade group includes a first shift register RS_A1, a first shift register RS_A2, and a first shift register RS_A3, and the second cascade group includes a second shift register RS_B1, a second shift register RS_B2, and a second shift register RS_B3.

For a sub-pixel P2 in a sub-pixel row corresponding to the second shift register RS_B1, the first output terminal Out1 of the first shift register RS_A1 is electrically connected to a third gate signal terminal Gate_n−1 of the sub-pixel P2; the first output terminal Out1 of the second shift register RS_B1 is electrically connected to a first gate signal terminal Gate_n of the sub-pixel P2, and the second output terminal out2 of the second shift register RS_B1 is electrically connected to a first enable signal terminal EM_n of the sub-pixel P2; a first output terminal Out1 of the first shift register RS_A2 is electrically connected to a second gate signal terminal Gate_n+1 of the P2, and a second output terminal Out2 of the first shift register RS_A2 is electrically connected to a second enable signal terminal EM_n+1 of the sub-pixel P2.

The first output terminal Out1 of the first shift register RS_A1 is further electrically connected to the input terminal In of the first shift register RS_A2, and the first output terminal Out1 of the first shift register RS_A2 is further electrically connected to the input terminal In of the first shift register RS_A3. The first output terminal Out1 of the second shift register RS_B1 is electrically connected to an input terminal In of the second shift register RS_B2, and a first output terminal Out1 of the second shift register RS_B2 is electrically connected to an input terminal In of the second shift register RS_B3.

The pixel circuit in the sub-pixel P of the display panel 100 will be described below.

Figure 7:
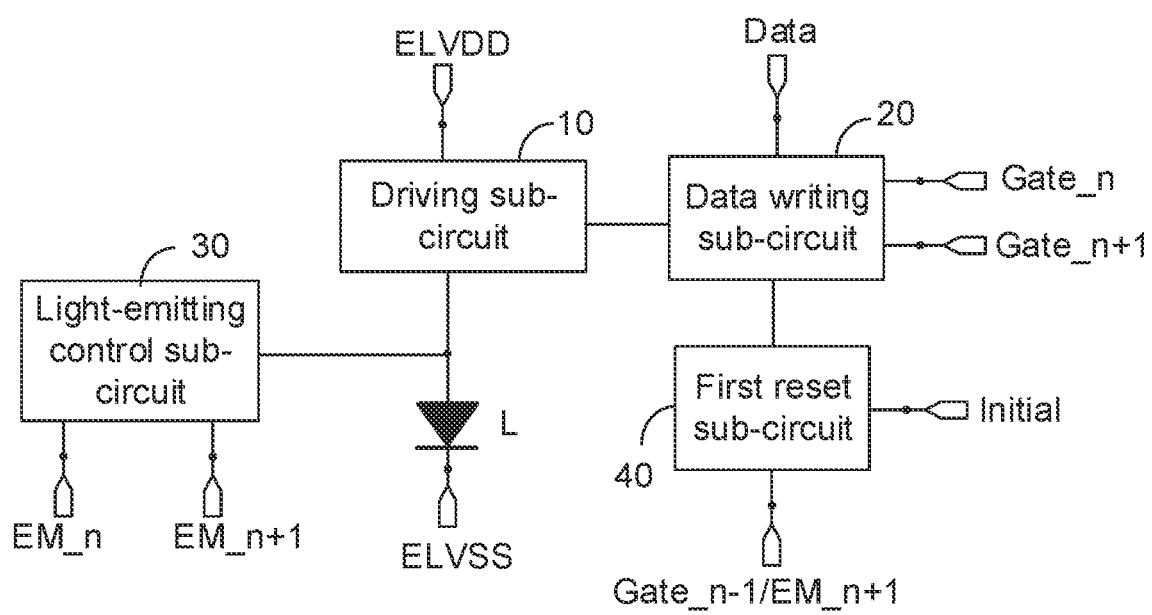
FIG. 7 is a schematic diagram illustrating a structure of a pixel circuit, in accordance with some embodiments.

In some embodiments, referring to FIG. 7, the pixel circuit in the sub-pixel P includes a driving sub-circuit 10, a data writing sub-circuit 20 and a light-emitting control sub-circuit 30.

The driving sub-circuit 10 is electrically connected to a first power supply voltage terminal ELVDD and a first electrode of the light-emitting device L, and a second electrode of the light-emitting device L is electrically connected to a second power supply voltage terminal ELVSS. The data writing sub-circuit 20 is electrically connected to a first gate signal terminal Gate_n of the sub-pixel P, a second gate signal terminal Gate_n+1 of the sub-pixel P, a data voltage signal terminal Data, and the driving sub-circuit 10. The light-emitting control sub-circuit 30 is electrically connected to a first enable signal terminal EM_n of the sub-pixel P, a second enable signal terminal EM_n+1 of the sub-pixel P, the driving sub-circuit 10, and the first electrode of the light-emitting device L. It will be noted that, voltage signals provided by the first power supply voltage terminal ELVDD and the second power supply voltage terminal ELVSS are voltage signals with substantially constant voltage values.

The data writing sub-circuit 20 is configured to write a data voltage signal Vdata from the data voltage signal terminal Data into the driving sub-circuit 10 and compensate the data voltage signal Vdata, in response to a first gate signal Vg1 from the first gate signal terminal Gate_n and a second gate signal Vg2 from the second gate signal terminal Gate_n+1.

The light-emitting control sub-circuit 30 is configured to close a line between the first power supply voltage terminal ELVDD and the second power supply voltage terminal ELVSS, in response to a first enable signal Vem1 from the first enable signal terminal EM_n and a second enable signal Vem2 from the second enable signal terminal EM_n+1.

Figure 8:
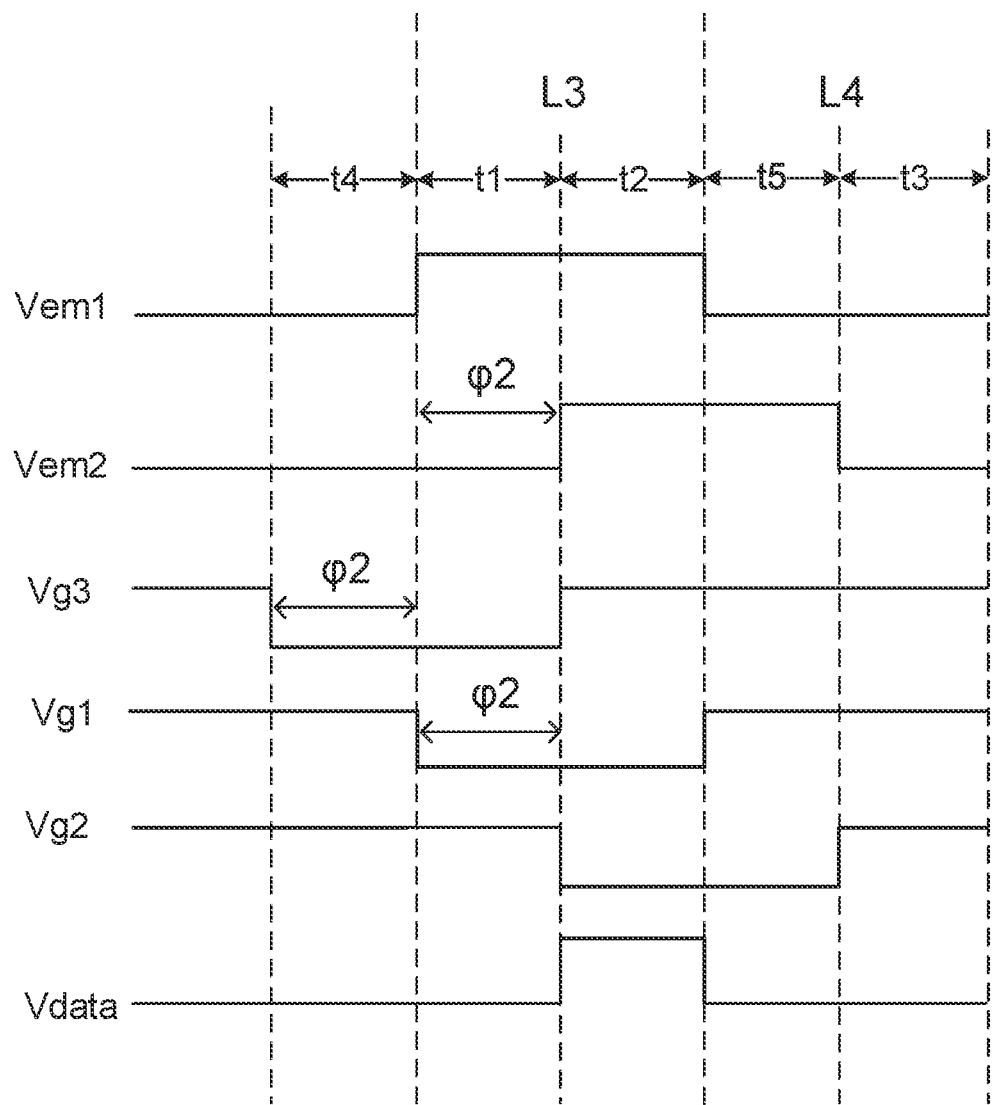
FIG. 8 is a signal timing diagram of a pixel circuit, in accordance with some embodiments.

The driving sub-circuit 10 is configured to provide a driving current to the corresponding light-emitting device L through the closed line between the first power supply voltage terminal ELVDD and the second power supply voltage terminal ELVSS according to the written data voltage signal Vdata. Herein, the data voltage signal Vdata written into the driving sub-circuit 10 has been compensated. Referring to FIG. 8, phases of the first enable signal Vem1 and the first gate signal Vg1 are opposite, and phases of the second enable signal Vem2 and the second gate signal Vg2 are opposite.

When the pixel circuit drives the corresponding light-emitting device L to emit light, the required first gate signal Vg1, second gate signal Vg2, first enable signal Vem1 and second enable signal Vem2 includes two pairs of signals with opposite phases, i.e., the phases of the first gate signal Vg1 and the first enable signal Vem1 are opposite, and the phases of the second gate signal Vg2 and the second enable signal Vem2 are opposite. In a case where the display apparatus 100 includes at least one gate driver circuit 5 as shown in FIG. 2A or 2B, the gate driver circuit 5 may output two pairs of signals with opposite phases, i.e., the first output signal V1 and the second output signal V2 with opposite phases, and the third output signal V3 and the fourth output signal V4 with opposite phases. Therefore, the first output signal V1 and the second output signal V2, and the third output signal V3 and the fourth output signal V4 may be used as the two pairs of signals with opposite phases required by the pixel circuit. In this way, each sub-pixel row only needs to be electrically connected to one gate driver circuit 5 to achieve progressive scanning of the sub-pixels of the display panel 100, instead of providing a gate driver circuit for the data writing sub-circuit 20 and another gate driver circuit for the light-emitting control sub-circuit 30, i.e., one sub-pixel row does not need to electrically connected to two gate driver circuits. Accordingly, the number of the gate driver circuits disposed in the display panel 100 may be reduced, and space for arranging the gate driver circuits in the display panel 100 may be reduced, thereby facilitating to reduce a size of a bezel of the display apparatus 100.

In some embodiments, as shown in FIG. 7, the pixel circuit further includes a first reset sub-circuit 40. The first reset sub-circuit 40 is electrically connected to a reset signal terminal Initial, and the data writing sub-circuit 20. Herein, the first reset sub-circuit 40 is further electrically connected to the second enable signal terminal EM_n+1 or the third gate signal terminal Gate_n−1 of the sub-pixel P. The first reset sub-circuit 40 is configured to transmit a reset voltage signal Vint from the reset signal terminal Initial to the driving sub-circuit 10 through the data writing sub-circuit 20, in response to the second enable signal Vem2 from the second enable signal terminal EM_n+1 or a third gate signal Vg3 from the third gate signal terminal Gate_n−1, so as to reset the driving sub-circuit 10. Herein, the first reset sub-circuit 40 may reset the driving sub-circuit 10, thereby facilitating to eliminate an afterimage of an image displayed in a previous frame by the display panel 100.

Figure 9:
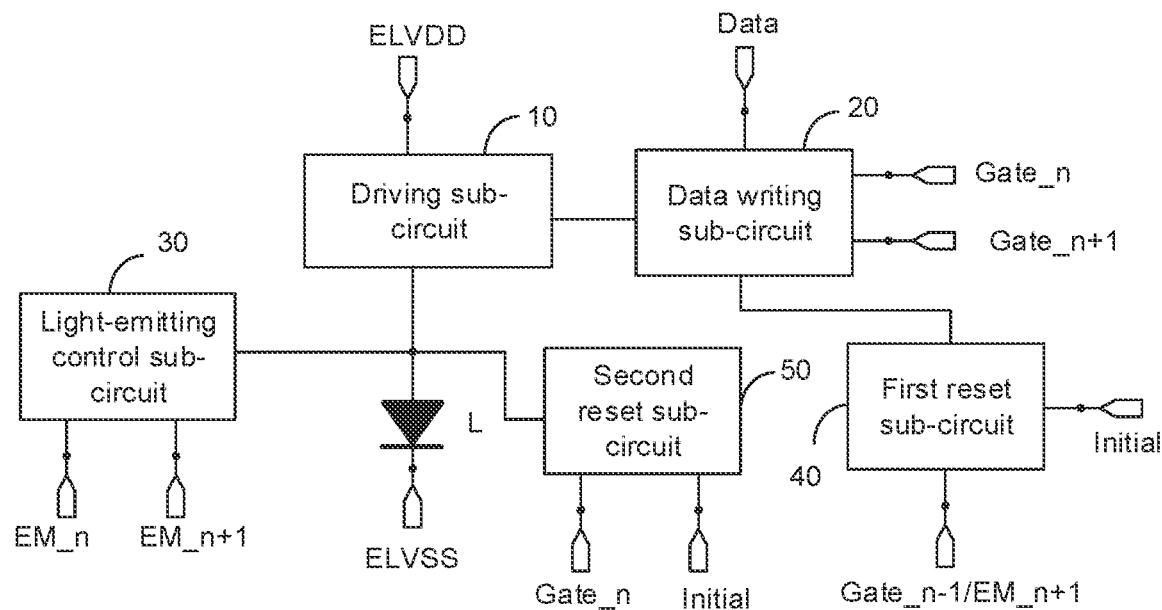
FIG. 9 is a schematic diagram illustrating a structure of another pixel circuit, in accordance with some embodiments.

In some embodiments, as shown in FIG. 9, the pixel circuit further includes a second reset sub-circuit 50. The second reset sub-circuit 50 is electrically connected to the first gate signal terminal Gate_n of the sub-pixel P, the reset signal terminal Initial, and the first electrode of the light-emitting device L. The second reset sub-circuit 50 is configured to transmit the reset voltage signal Vint from the reset signal terminal Initial to the first electrode of the light-emitting device L in response to the first gate signal Vg1, so as to reset the light-emitting device L.

Since the pixel circuit further includes the second reset sub-circuit 50, the second reset sub-circuit 50 may reset the light emitting device L. When the first reset sub-circuit 40 resets the driving sub-circuit 10, the light-emitting device L may also be reset by the second reset sub-circuit 50, so that aging of the light-emitting device L may be alleviated, which may improve a service life of the display apparatus.

The sub-circuits in the pixel circuit will be exemplarily described below with reference to FIGS. 10 to 14.

Figure 10:
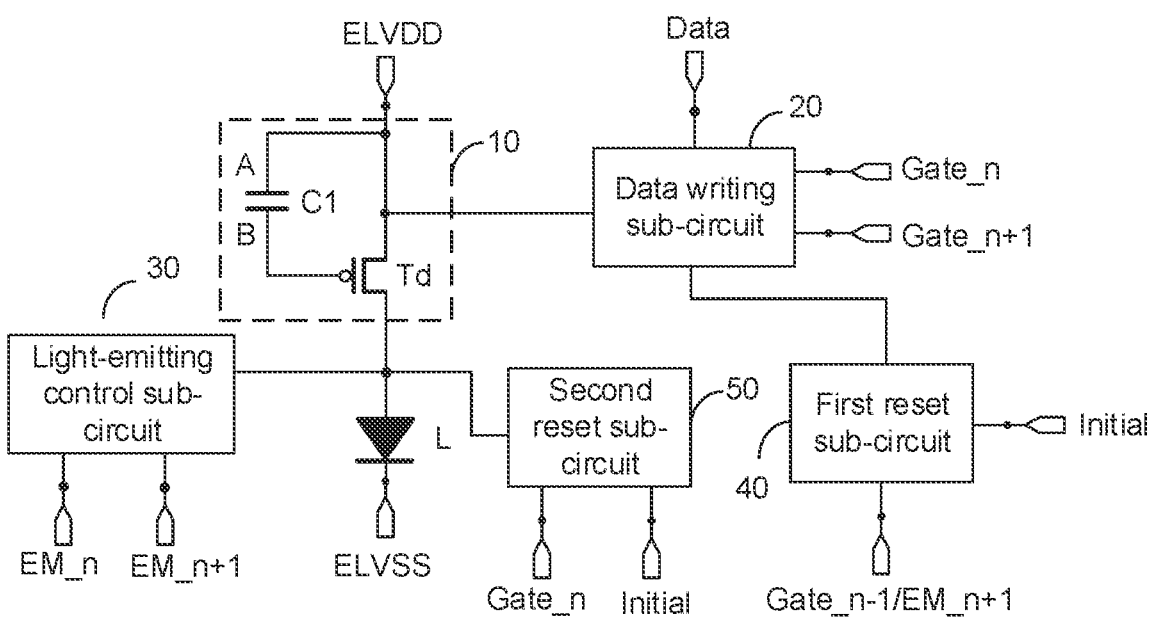
FIG. 10 is a schematic diagram illustrating a structure of yet another pixel circuit, in accordance with some embodiments.
Figure 11:
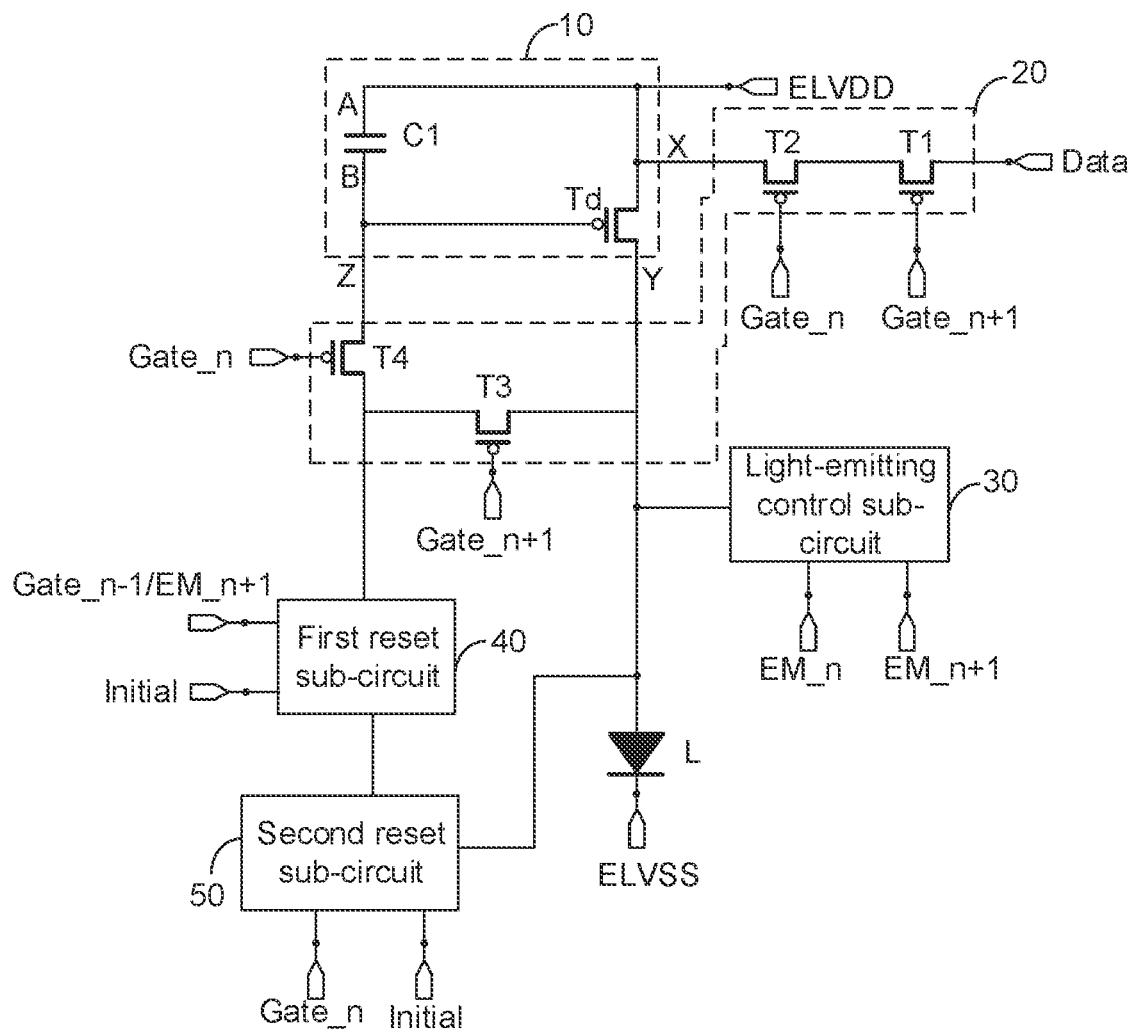
FIG. 11 is a schematic diagram illustrating a structure of yet another pixel circuit, in accordance with some embodiments.

In some embodiments, as shown in FIGS. 10 and 11, the driving sub-circuit 10 includes a driving transistor Td and a first capacitor C1. A first electrode of the driving transistor Td is electrically connected to the data writing sub-circuit 20, and a second electrode of the driving transistor Td is electrically connected to the light-emitting control sub-circuit 30. A first terminal A of the first capacitor C1 is electrically connected to the first power supply voltage terminal ELVDD, and a second terminal B of the first capacitor C1 is electrically connected to a gate of the driving transistor Td and the data writing sub-circuit 20.

In some embodiments, as shown in FIG. 11, the data writing sub-circuit 20 includes a first transistor T1, a second transistor T2, a third transistor T3, and a fourth transistor T4. A gate of the first transistor T1 is electrically connected to the second gate signal terminal Gate_n+1 of the sub-pixel P, and a first electrode of the first transistor T1 is electrically connected to the data voltage signal terminal Data. A gate of the second transistor T2 is electrically connected to the first gate signal terminal Gate_n of the sub-pixel P, a first electrode of the second transistor T2 is electrically connected to a second electrode of the first transistor T1, and a second electrode of the second transistor T2 is electrically connected to a first terminal X of the driving sub-circuit 10. A gate of the third transistor T3 is electrically connected to the second gate signal terminal Gate_n+1 of the sub-pixel P, and a first electrode of the third transistor T3 is electrically connected to a second terminal Y of the driving sub-circuit 10. A gate of the fourth transistor T4 is electrically connected to the first gate signal terminal Gate_n of the sub-pixel P, a first electrode of the fourth transistor T4 is electrically connected to a second electrode of the third transistor T3, and a second electrode of the fourth transistor T4 is electrically connected to a third terminal Z of the driving sub-circuit 10.

It will be noted that, positions of the first transistor T1 and the second transistor T2 in the data writing sub-circuit 20 may be interchanged. For example, the first electrode of the second transistor T2 is electrically connected to the data voltage signal terminal Data, the second electrode of the second transistor T2 is electrically connected to the first electrode of the first transistor T1, and the second electrode of the first transistor T1 is electrically connected to the first terminal X of the driving sub-circuit 10. In this case, the first gate signal terminal Gate_n is still connected to the gate of the first transistor T1, and the second gate signal terminal Gate_n+1 is still connected to the gate of the second transistor T2.

Referring to FIGS. 8 and 11, when the first gate signal Vg1 and the second gate signal Vg2 are both in their active level periods, the first transistor T1, the second transistor T2, the third transistor T3 and the fourth transistor T4 are all turned on, and the data voltage signal Vdata from the data voltage signal terminal Data is written into the driving sub-circuit 10 through the first transistor T1, the second transistor T2, the third transistor T3 and the fourth transistor T4, and is compensated. In a case where the driving sub-circuit 10 includes the driving transistor Td and the first capacitor C1, the data voltage signal Vdata is transmitted to the second terminal B of the first capacitor C1, and the first capacitor C1 is charged until a voltage of the second terminal B reaches a sum of Vdata and Vth (i.e., Vdata+Vth), where Vth is a threshold voltage of the driving transistor Td.

For example, in a case where the first transistor T1 to the fourth transistor T4 are all P-type transistors, in a second phase t2, the first gate signal Vg1 and the second gate signal Vg2 are each in a low level period, so that the first transistor T1 to the fourth transistor T4 are all turned on, and the data voltage signal Vdata can be written into the driving sub-circuit 10 and can be compensated.

Figure 12:
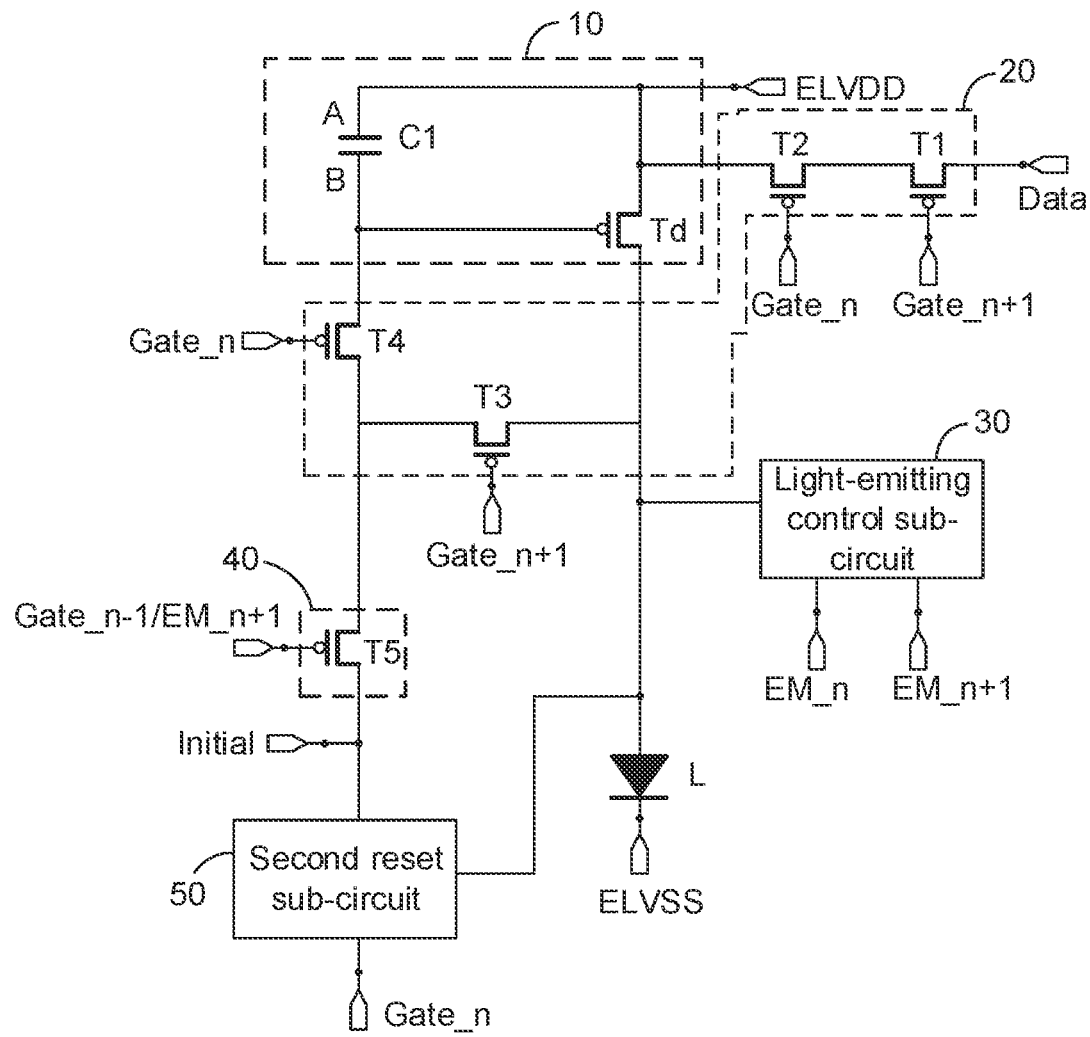
FIG. 12 is a schematic diagram illustrating a structure of yet another pixel circuit, in accordance with some embodiments.

In some embodiments, as shown in FIG. 12, the first reset sub-circuit 40 includes a fifth transistor T5. A gate of the fifth transistor T5 is electrically connected to the second enable signal terminal EM_n+1 or the third gate signal terminal Gate_n−1 of the sub-pixel P, a first electrode of the fifth transistor T5 is electrically connected to the reset signal terminal Initial, and a second electrode of the fifth transistor T5 is electrically connected to the second electrode of the third transistor T3 and the first electrode of the fourth transistor T4.

Referring to FIGS. 8 and 12, taking an example in which the transistors in FIG. 12 are all P-type transistors, in a first phase t1, the second enable signal Vem2 or the third gate signal Vg3 is in a low level period, and the first gate signal Vg1 is in a low level period, so that the fourth transistor T4 and the fifth transistor T5 are turned on, and the reset voltage signal Vint from the reset signal terminal Initial is transmitted to the second terminal B of the first capacitor C1 and the gate of the driving transistor Td through the fourth transistor T4 and the fifth transistor T5, so as to reset the driving transistor Td and the first capacitor C1.

Figure 13:
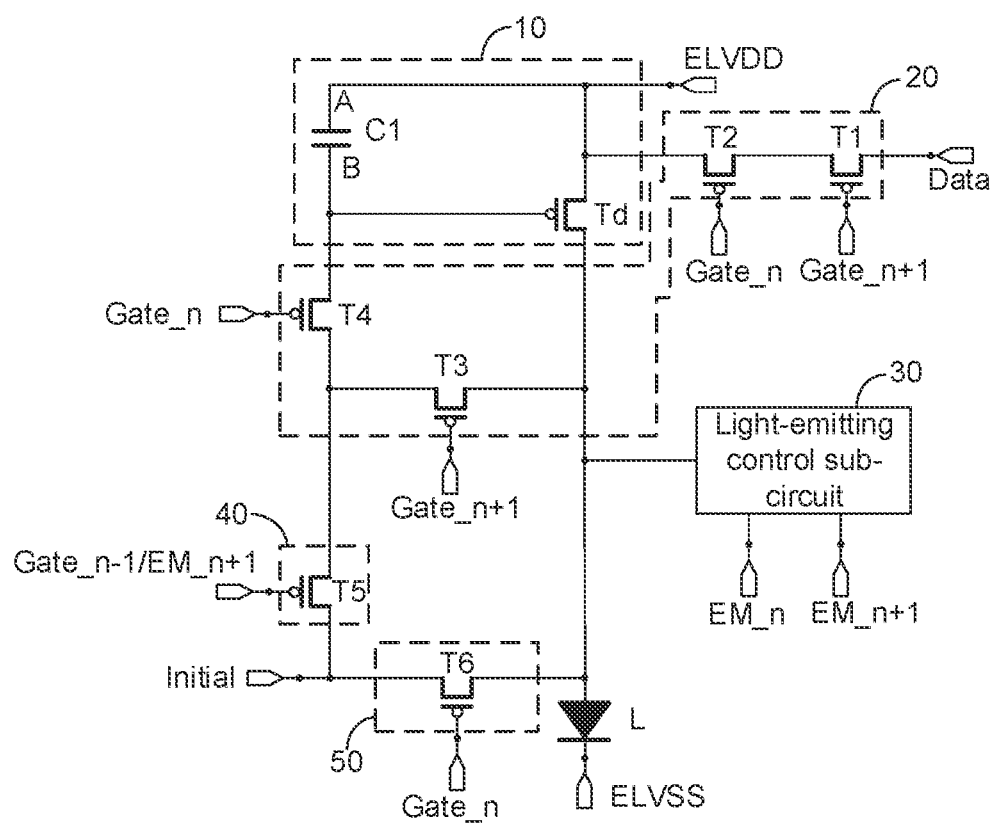
FIG. 13 is a schematic diagram illustrating a structure of yet another pixel circuit, in accordance with some embodiments.

In some embodiments, as shown in FIG. 13, the second reset sub-circuit 50 includes a sixth transistor T6. A gate of the sixth transistor T6 is electrically connected to the first gate signal terminal Gate_n of the sub-pixel P, a first electrode of the sixth transistor T6 is electrically connected to the reset signal terminal Initial, and a second electrode of the sixth transistor T6 is electrically connected to the first electrode of the light-emitting device L.

Referring to FIGS. 8 and 13, taking an example in which the transistors in FIG. 13 are all P-type transistors, in the first phase t1, the first gate signal Vg1 is in a low level period, so that the sixth transistor T6 is turned on, and the reset voltage signal Vint from the reset signal terminal Initial is transmitted to the first electrode of the light-emitting device L through the sixth transistor T6, so as to reset the light-emitting device L.

Figure 14:
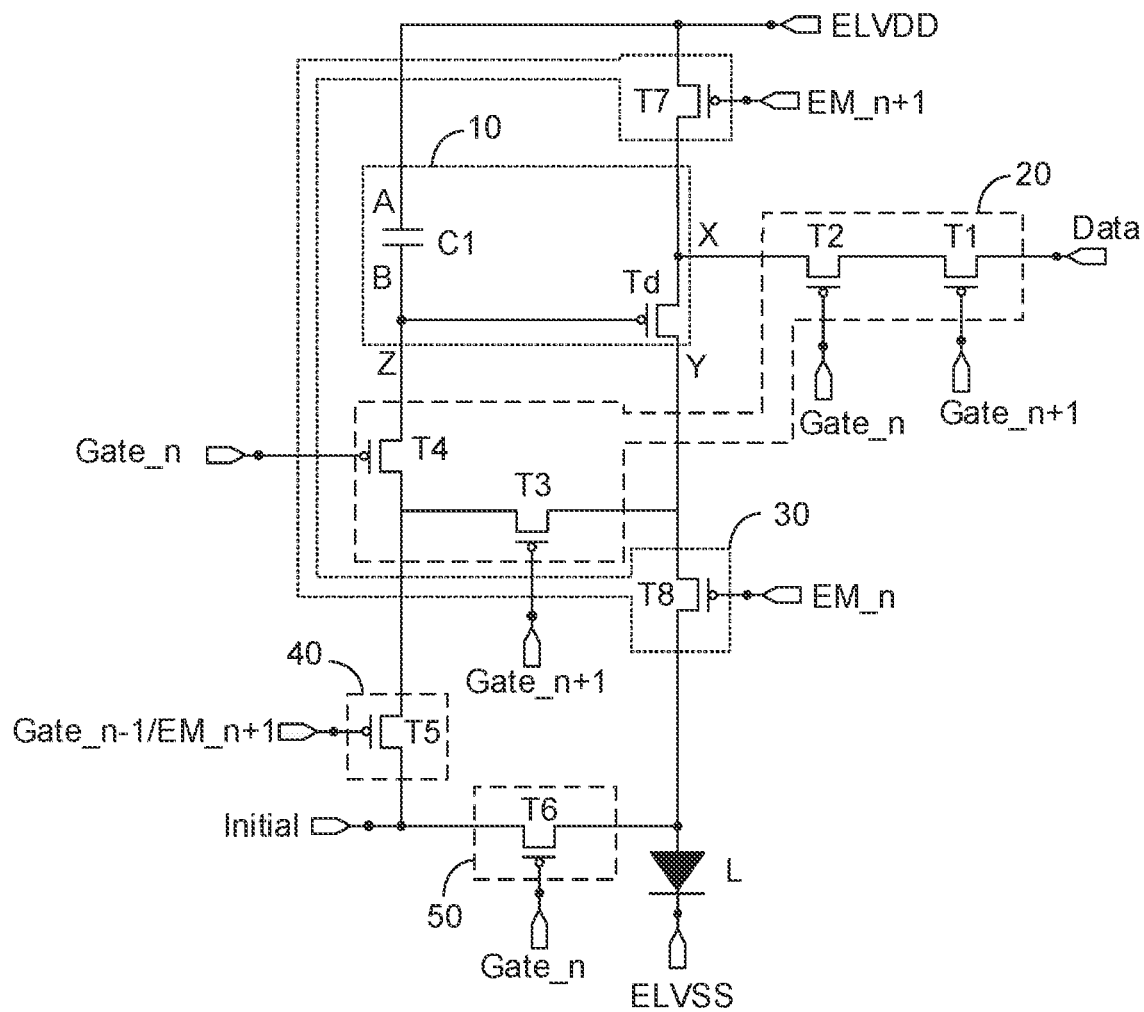
FIG. 14 is a schematic diagram illustrating a structure of yet another pixel circuit, in accordance with some embodiments.

In some embodiments, as shown in FIG. 14, the light-emitting control sub-circuit 30 includes a seventh transistor T7 and an eighth transistor T8. A gate of the seventh transistor T7 is electrically connected to the second enable signal terminal EM_n+1 of the sub-pixel P, a first electrode of the seventh transistor T7 is electrically connected to the first power supply voltage terminal ELVDD, and a second electrode of the seventh transistor T7 is electrically connected to the first terminal X of the driving sub-circuit 10. A gate of the eighth transistor T8 is electrically connected to the first enable signal terminal EM_n of the sub-pixel P, a first electrode of the eighth transistor T8 is electrically connected to the second terminal Y of the driving sub-circuit 10, and a second electrode of the eighth transistor T8 is electrically connected to the first electrode of the light-emitting device L.

Herein, positions of the seventh transistor T7 and the eighth transistor T8 may be interchanged. For example, the first electrode of the eighth transistor T8 is electrically connected to the first power supply voltage terminal ELVDD, and the second electrode of the eighth transistor T8 is electrically connected to the first terminal X of the driving sub-circuit 10; and the first electrode of the seventh transistor T7 is electrically connected to the second terminal Y of the driving sub-circuit 10, and the second electrode of the seventh transistor T7 is electrically connected to the first electrode of the light-emitting device L.

Referring to FIGS. 8 and 14, taking an example in which the transistors in FIG. 14 are all P-type transistors, in a case where the gate of the fifth transistor T5 is electrically connected to the second enable signal terminal EM_n+1 of the sub-pixel P, in a process of resetting the gate of the driving transistor Td in the first phase t1, the second enable signal Vem2 is in a low level period, so that the seventh transistor T7 is turned on. Since the first electrode of the seventh transistor T7 is electrically connected to the first power supply voltage terminal ELVDD, a first voltage signal from the first power supply voltage terminal ELVDD is transmitted to the first electrode of the driving transistor Td through the seventh transistor T7, and since a voltage of the reset voltage signal Vint is less than a voltage of the first voltage signal of the first power supply voltage terminal ELVDD, the following magnitude relationship holds: a difference between the voltages of Vint and ELVDD is less than Vth (i.e., Vint−ELVDD<Vth), in which case the driving transistor Td is turned on.

In a third phase t3, the first enable signal Vem1 and the second enable signal Vem2 are each in a low level period, so that the seventh transistor T7 and the eighth transistor T8 are turned on, and the line between the first power supply voltage terminal ELVDD and the second power supply voltage terminal ELVSS is closed (i.e., a current path is formed between the seventh transistor T7 and the eighth transistor T8), and the driving sub-circuit 10 provides a driving current to the light-emitting device L through the current path to drive the light-emitting device L to emit light.

It will be noted that, the driving transistor Td, the first transistor T1, the second transistor T2, the third transistor T3, the fourth transistor T4, the fifth transistor T5, the sixth transistor T6, the seventh transistor T7 and the eighth transistor T8 may also be N-type transistors. The pixel circuit may be adaptively adjusted according to different types of the transistors.

In a case where the driving transistor Td, the first transistor T1, the second transistor T2, the third transistor T3, the fourth transistor T4, the fifth transistor T5, the sixth transistor T6, the seventh transistor T7 and the eighth transistor T8 are all N-type transistors, active levels of the first enable signal Vem1, the second enable signal Vem2, the first gate signal Vg1, the second gate signal Vg2 and the third gate signal Vg3 are high levels, that is, when these signals are in their low level periods, the transistors are turned on.

In a case where the driving transistor Td, the first transistor T1, the second transistor T2, the third transistor T3, the fourth transistor T4, the fifth transistor T5, the sixth transistor T6, the seventh transistor T7 and the eighth transistor T8 are all P-type transistors, active levels of the above signals are low levels, that is, when the above signals are in their low level periods, the transistors are turned on.

In addition, it is taken as an example that the transistors in the pixel circuit in some embodiments of the present disclosure are all the P-type transistors for illustration. A person skilled in the art will understand that, a structure of the pixel circuit in which the driving transistor Td, the first transistor T1, the second transistor T2, the third transistor T3, the fourth transistor T4, the fifth transistor T5, the sixth transistor T6, the seventh transistor T7 and the eighth transistor T8 are the N-type transistors may be obtained with no doubt, according to a connection manner of the pixel circuit in which the driving transistor Td, the first transistor T1, the second transistor T2, the third transistor T3, the fourth transistor T4, the fifth transistor T5, the sixth transistor T6, the seventh transistor T7 and the eighth transistor T8 are the P-type transistors, and details will not be repeated herein, but they should both be within the protection scope of the present disclosure.

The first electrode of the transistor mentioned in the above embodiments is one of a drain and a source, and the second electrode thereof is the other one of the drain and the source, which is not limited. In addition, according to different conductive methods of transistors, the transistors may include two categories: enhancement-mode transistors and depletion-mode transistors. In the above embodiments, it is not limited whether the transistors in the pixel circuit are the enhancement-mode transistors or the depletion-mode transistors.

The structure of the pixel circuit will be exemplarily described below with reference to FIG. 14. The pixel circuit includes the first transistor T1 to the eighth transistor T8, and the first capacitor C1.

The gate of the first transistor T1 is electrically connected to the second gate signal terminal Gate_n+1, the first electrode of the first transistor T1 is electrically connected to the data voltage signal terminal Data, and the second electrode of the first transistor T1 is electrically connected to the first electrode of the second transistor T2.

The gate of the second transistor T2 is electrically connected to the first gate signal terminal Gate_n, and the second electrode of the second transistor T2 is electrically connected to the first electrode of the driving transistor Td.

The gate of the third transistor T3 is electrically connected to the second gate signal terminal Gate_n+1, the first electrode of the third transistor T3 is electrically connected to the second electrode of the driving transistor Td, and the second electrode of the third transistor T3 is electrically connected to the first electrode of the fourth transistor T4.

The gate of the fourth transistor T4 is electrically connected to the first gate signal terminal Gate_n, the first electrode of the fourth transistor T4 is further electrically connected to the second electrode of the fifth transistor T5, and the second electrode of the fourth transistor T4 is electrically connected to the gate of the driving transistor Td and the second terminal B of the first capacitor C1.

The gate of the driving transistor Td is further electrically connected to the second terminal B of the first capacitor C1, the first electrode of the driving transistor Td is further electrically connected to the second electrode of the seventh transistor T7, and the second electrode of the driving transistor Td is further electrically connected to the first electrode of the eighth transistor T8.

The first terminal A of the first capacitor C1 is electrically connected to the first power supply voltage terminal ELVDD.

The gate of the fifth transistor T5 is electrically connected to the second enable signal terminal EM_n+1 or the third gate signal terminal Gate_n−1, and the first electrode of the fifth transistor T5 is electrically connected to the reset signal terminal Initial.

The gate of the sixth transistor T6 is electrically connected to the first gate signal terminal Gate_n, the first electrode of the sixth transistor T6 is electrically connected to the reset signal terminal Initial, and the second electrode of the sixth transistor T6 is electrically connected to the first electrode of the light-emitting device L.

The gate of the seventh transistor T7 is electrically connected to the second enable signal terminal EM_n+1, and the first electrode of the seventh transistor T7 is electrically connected to the first power supply voltage terminal ELVDD.

The gate of the eighth transistor T8 is electrically connected to the first enable signal terminal EM_n, and the second electrode of the eighth transistor T8 is electrically connected to the first electrode of the light-emitting device L.

In some embodiments, referring to FIGS. 2A to 4, each gate driver circuit 5 is electrically connected to a plurality of sub-pixel rows in the sub-pixel array, and each shift register RS in the gate driver circuit 5 is electrically connected to a corresponding sub-pixel row of the plurality of sub-pixel rows. For example, referring to FIG. 3, the first shift register RS_A1 is electrically connected to a sub-pixel row including a plurality of sub-pixels P1; the second shift register RS_B1 is electrically connected to a sub-pixel row including a plurality of sub-pixels P2; and the second shift register RS_B3 is electrically connected to a sub-pixel row including a plurality of sub-pixels P6.

Taking a sub-pixel row electrically connected to a first shift register RS_A as an example, a pixel circuit in each sub-pixel P in the sub-pixel row is configured to receive a first output signal V1 output by the first shift register RS_A as a first gate signal Vg1 thereof, and a second output signal V2 output by the first shift register RS_A as a first enable signal Vem1 thereof; and receive a third output signal V3 output by a second shift register RS_B corresponding to a next sub-pixel row as a second gate signal Vg2 thereof, and a fourth output signal V4 output by the second shift register RS_B as a second enable signal Vem2 thereof. For example, for a sub-pixel P3, its corresponding first shift register RS_A2 outputs a first gate signal Vg1 as its first gate signal Vg1, and a second output signal V2 as its first enable signal Vem1; a second shift register RS_B2 corresponding to a sub-pixel P4, which is in a next sub-pixel row of the sub-pixel P3, outputs a third output signal V3 as the second gate signal Vg2 of the sub-pixel P3, and a fourth output signal V4 as the second enable signal Vem2 of the sub-pixel P3.

On this basis, in some embodiments, referring to FIGS. 3, 8 and 14, in a case where the pixel circuit further includes the first reset sub-circuit 40, the pixel circuit is further configured to receive a third output signal V3 output by a second shift register RS_B corresponding to a previous sub-pixel row of the sub-pixel row as a third gate signal Vg3 thereof. For example, for the sub-pixel P3 shown in FIG. 3, a second shift register RS_B1 corresponding to a sub-pixel P2, which is in a previous sub-pixel row of the sub-pixel P3, outputs a third output signal V3 as the third gate signal Vg3 of the sub-pixel P3.

As another example, for a sub-pixel row electrically connected to a second shift register RS_B, a pixel circuit in each sub-pixel P is configured to receive a third output signal V3 output by the second shift register RS_B as a first gate signal Vg1 thereof, and a fourth output signal V4 output by the second shift register RS_B as a first enable signal Vem1 thereof; and receive a first output signal V1 output by a first shift register RS_A corresponding to a next sub-pixel row as a second gate signal Vg2 thereof, and a second output signal V2 output by the first shift register RS_A2 as a second enable signal Vem2 thereof. For example, for a sub-pixel P2, its corresponding second shift register RS_B1 outputs a third gate signal Vg2 as its first gate signal Vg1, and a fourth output signal V4 as its first enable signal Vem1; a first shift register RS_A1 corresponding to a sub-pixel P1, which is in a next sub-pixel row of the sub-pixel P2, outputs a first output signal V1 as the second gate signal Vg2 of the sub-pixel P2, and a second output signal V2 as the second enable signal Vem2 of the sub-pixel P2.

On this basis, in some embodiments, referring to FIGS. 3, 8 and 14, in a case where the pixel circuit further includes the first reset sub-circuit 40, the pixel circuit is further configured to receive a first output signal V1 output by a first shift register RS_A corresponding to a previous sub-pixel row of the sub-pixel row as a third gate signal Vg3 thereof. For example, for the sub-pixel P2 shown in FIG. 3, a first shift register RS_A1 corresponding to a sub-pixel P1, which is in a previous sub-pixel row of the sub-pixel P2, outputs a third output signal V3 as the third gate signal Vg3 of the sub-pixel P2.

Some embodiments of the present disclosure provide a method for driving the above pixel circuit.

Referring to FIGS. 8 and 14, the pixel circuit has a second phase t2 and a third phase t3 in an image frame. The driving method includes the following steps.

In the second phase t2, the data writing sub-circuit 20 writes the data voltage signal Vdata from the data voltage terminal Data into the driving sub-circuit 10 and compensate the data voltage signal Vdata, in response to the first gate signal Vg1 and the second gate signal Vg2.

In the third phase t3, the light-emitting control sub-circuit 30 closes the line between the first power supply voltage terminal ELVDD and the second power supply voltage terminal ELVSS, in response to the first enable signal Vem1 and the second enable signal Vem2; and the driving sub-circuit 10 provides a driving current to the corresponding light-emitting device L through the closed line between the first power supply voltage terminal ELVDD and the second power supply voltage terminal ELVSS according to the data voltage signal Vdata written into the driving sub-circuit 10. Herein, the phases of the first enable signal Vem1 and the first gate signal Vg1 are opposite, and the phases of the second gate signal Vem2 and the second enable signal Vg2 are opposite.

The driving method has the same beneficial effects as the pixel circuit and the display panel described above, and details will not be repeated herein.

For example, referring to FIG. 8, waveforms of the first enable signal Vem1 and the second enable signal Vem2 are the same. There is a phase difference between the first enable signal Vem1 and the second enable signal Vem2, the first enable signal Vem1 has a third level period L3 and a fourth level period L4 in sequence within one cycle, and the duration corresponding to the phase difference φ2 is less than a duration of the third level period L3 of the first enable signal Vem1. In this way, the first enable signal Vem1 and the second enable signal Vem2 may both be at a fourth level which is an active level for a corresponding transistor (i.e., a level at which the corresponding transistor is turned on) in the third phase t3, thereby ensuring that the line between the first power supply voltage terminal ELVDD and the second power supply voltage terminal ELVSS is closed in the third phase t3.

In some embodiments, referring to FIG. 8 to 14, in the case where the pixel circuit further includes the first reset sub-circuit 40 electrically connected to the data writing sub-circuit 20, the image frame further includes the first phase t1 before the second phase t2. The driving method further includes: in the first phase t1, the first reset sub-circuit 40 transmits the reset voltage signal Vint from the reset signal terminal Initial to the driving sub-circuit 10 through the data writing sub-circuit 20, in response to the second enable signal Vem2 or the third gate signal Vg3, so as to reset the driving sub-circuit 10.

On this basis, in some embodiments, in a case where the pixel circuit further includes the second reset sub-circuit 50 electrically connected to the corresponding light-emitting device L, in the first phase t1, the driving method further includes: the second reset sub-circuit 50 transmits the reset voltage signal Vint from the reset signal terminal Initial to the corresponding light-emitting device L in response to the first gate signal Vg1, so as to reset the corresponding light-emitting device L.

The driving method will be described below in combination with timings of signals shown in FIG. 8 and the pixel circuit shown in FIG. 14 by taking an example in which the transistors included in the pixel circuit are all the P-type transistors. Herein, it is taken as an example that the first reset sub-circuit 40 is electrically connected to the third gate signal terminal Gate_n−1, a third level of the first enable signal Vem1 is a high level, and a fourth level of the first enable signal Vem1 is a low level, the first electrode of the light-emitting device L is an anode, and the first electrode of each transistor is the source and the second electrode thereof is the drain.

The pixel circuit includes the first phase t1, the second phase t2 and the third phase t3 in an image frame. The driving method includes the following steps.

In the first phase t1, the first enable signal Vem1 is at a high level, the second enable signal Vem2 is at a low level, the third gate signal Vg3 is at a low level, the first gate signal Vg1 is at a low level, and the second gate signal Vg2 is at a high level. On this basis, the second transistor T2, the fourth transistor T4, the fifth transistor T5, the sixth transistor T6 and the seventh transistor T2 are turned on, and the first transistor T1, the third transistor T3 and the eighth transistor T8 are turned off.

The fourth transistor T4 and the fifth transistor T5 are turned on, so that the reset voltage signal Vint from the reset signal terminal Initial is transmitted to the gate of the driving transistor Td and the second terminal B of the first capacitor C1 through the fourth transistor T4 and the fifth transistor T5, so as to reset the gate of the driving transistor Td and the second terminal B of the first capacitor C1. The sixth transistor T6 is turned on, so that the reset voltage signal Vint from the reset signal terminal Initial is transmitted to the anode of the light-emitting device L through the sixth transistor T6, so as to reset the anode of the light-emitting device L.

It will be understood that, since the seventh transistor T7 is turned on, the first voltage signal from the first power supply voltage terminal ELVDD is transmitted to the source of the driving transistor Td through the seventh crystal T7, so that the driving transistor Td may be maintained in a turn-on state.

It will be noted herein that, since the second transistor T2 is turned on and the first transistor T1 is turned off, the data voltage signal Vdata from the data voltage terminal Data is not transmitted to the driving transistor Td.

In the second phase t2ignal, the first gate signal Vg1 and the second gate s Vg2 each are at a low level, and the first enable signal Vem1, the second enable signal Vem2 and the third gate signal Vg3 each are at a high level. On this basis, the first transistor T1, the second transistor T2, the third transistor T3, the fourth transistor T4 and the sixth transistor T6 are turned on, and the fifth transistor T5, the seventh transistor T7 and the eighth transistor T8 are turned off.

Since the first transistor T1, the second transistor T2, the third transistor T3 and the fourth transistor T4 are turned on, the data voltage signal Vdata from the data voltage terminal Data is transmitted to the second terminal B of the first capacitor C1 through the first transistor T1, the first transistor T2, the third transistor T3, the fourth transistor T4 and the driving transistor Td, so as to charge the first capacitor C1 until the voltage transmitted to the second terminal B of the first capacitor C1 through the first transistor T1, the first transistor T2, the third transistor T3, the fourth transistor T4 and the driving transistor Td reaches the sum of Vdata and Vth (i.e., Vdata+Vth), at which time a gate to source voltage Vgs of the driving transistor Td reaches a difference of (Vdata+Vth) and ELVDD (i.e., Vgs=Vdata+Vth−ELVDD). Since a current I flowing through the driving transistor Td (i.e., the driving current for driving the light-emitting device L) is calculated according to: $I=k(Vgs-Vth)^2=k(Vdata+Vth-ELVDD-Vth)^2=k(Vdata-ELVDD)^2$, the current I flowing through the driving transistor Td is a product of k and a second power of a difference of Vdata and ELVDD, so that the current flowing through the driving transistor Td may be made independent of the threshold voltage Vth of the driving transistor Td, thereby achieving compensation of the threshold voltage Vth of the driving transistor Td.

In the third phase t3, the first enable signal Vem1 and the second enable signal Vem2 each are at a low level, and the first gate signal Vg1, the second gate signal Vg2 and the third gate signal Vg3 each are at a high level. On this basis, the seventh transistor T7 and the eighth transistor T8 are turned on, and the first transistor T1, the second transistor T2, the third transistor T3, the fourth transistor T4, the fifth transistor T5 and the sixth transistor T6 are turned off. Since the seventh transistor T7, the eighth transistor T8 and the driving transistor Td are turned on, a current path is formed between the first power supply voltage terminal ELVDD and the second power supply voltage terminal ELVDD, so that the light-emitting device L emits light.

It will be noted that, referring to FIG. 8, in the image frame, the pixel circuit further includes a fourth phase t4 before the first phase t1, and a fifth phase t5 between the second phase t2 and the third phase t3.

In the fourth phase t4, the first enable signal Vem1, the second enable signal Vem2 and the third gate signal Vg3 each are at a low level, and the first gate signal Vg1 and the second gate signal Vg2 each are at a high level. On this basis, the fifth transistor T5, the seventh transistor T7 and the eighth transistor T8 are turned on, and the first transistor T1, the second transistor T2, the third transistor T3, the fourth transistor T4, the sixth transistor T6 and the driving transistor Td are turned off. Therefore, the fourth phase t4 does not affect the resetting of the driving sub-circuit 10 by the first reset sub-circuit 40 and the resetting of the light-emitting device L by the second reset sub-circuit 50 in the subsequent first phase t1.

In the fifth phase t5, the first enable signal Vem1 and second gate signal Vg2 each are at a low level, and the first gate signal Vg1, the third gate signal Vg3 and the second enable signal Vem2 each are at a high level. On this basis, the first transistor T1, the third transistor T3, the eighth transistor T8 and the driving transistor Td are turned on, and the second transistor T2, the fourth transistor T4, the fifth transistor T5, the sixth transistor T6 and the seventh transistor T7 are turned off. Therefore, the fifth phase t5 does not affect operation of the light-emitting control sub-circuit 30 in the subsequent third phase t3.

The foregoing descriptions are merely specific implementations of the present disclosure, but the protection scope of the present disclosure is not limited thereto, and any changes or replacements that a person skilled in the art could conceive of within the technical scope of the present disclosure should be within the protection scope of the present disclosure. Therefore, the protection scope of the present disclosure shall be subject to the protection scope of the claims.

What is claimed is:

1. A pixel circuit, comprising:
   a data writing sub-circuit electrically connected to a driving sub-circuit, the data writing sub-circuit being configured to: write a data voltage signal from a data voltage signal terminal into the driving sub-circuit and compensate the data voltage signal, in response to a first gate signal from a first gate signal terminal and a second gate signal from a second gate signal terminal;
   a light-emitting control sub-circuit electrically connected to the driving sub-circuit, the light-emitting control sub-circuit being configured to close a line between a first power supply voltage terminal and a second power supply voltage terminal, in response to a first enable signal from a first enable signal terminal and a second enable signal from a second enable signal terminal; and
   the driving sub-circuit configured to provide a driving current to a light-emitting device through the closed line between the first power supply voltage terminal and the second power supply voltage terminal according to the written data voltage signal, wherein
      phases of the first enable signal and the first gate signal are opposite, and phases of the second enable signal and the second gate signal are opposite;
   wherein the data writing sub-circuit includes:
   a first transistor, a gate of the first transistor being electrically connected to the second gate signal terminal, and a first electrode of the first transistor being electrically connected to the data voltage signal terminal;
   a second transistor, a gate of the second transistor being electrically connected to the first gate signal terminal, a first electrode of the second transistor being electrically connected to a second electrode of the first transistor, and a second electrode of the second transistor being electrically connected to the driving sub-circuit;
   a third transistor, a gate of the third transistor being electrically connected to the second gate signal terminal, and a first electrode of the third transistor being electrically connected to the driving sub-circuit; and
   a fourth transistor, a gate of the fourth transistor being electrically connected to the first gate signal terminal, a first electrode of the fourth transistor being electrically connected to a second electrode of the third transistor, and a second electrode of the fourth transistor being electrically connected to the driving sub-circuit.

2. The pixel circuit according to claim 1, further comprising a first reset sub-circuit, wherein the first reset sub-circuit is electrically connected to the data writing sub-circuit; and the first reset sub-circuit is configured to transmit a reset voltage signal from a reset signal terminal to the driving sub-circuit through the data writing sub-circuit, in response to the second enable signal or a third gate signal from a third gate signal terminal, so as to reset the driving sub-circuit.

3. The pixel circuit according to claim 2, wherein the first reset sub-circuit includes:
   a fifth transistor; a gate of the fifth transistor being electrically connected to the second enable signal terminal or the third gate signal terminal, a first electrode of the fifth transistor being electrically connected to the reset signal terminal, and a second electrode of the fifth transistor being electrically connected to the second electrode of the third transistor and the first electrode of the fourth transistor.

4. The pixel circuit according to claim 1, wherein the light-emitting control sub-circuit includes:
   a seventh transistor, a gate of the seventh transistor being electrically connected to the second enable signal terminal, a first electrode of the seventh transistor being electrically connected to the first power supply voltage terminal, and a second electrode of the seventh transistor being electrically connected to the driving sub-circuit; and
   an eighth transistor, a gate of the eighth transistor being electrically connected to the first enable signal terminal, a first electrode of the eighth transistor being electrically connected to the driving sub-circuit, and a second electrode of the eighth transistor being electrically connected to the light-emitting device.

5. The pixel circuit according to claim 1, further comprising:
   a second reset sub-circuit electrically connected to the light-emitting device, the second reset sub-circuit being configured to transmit a reset voltage signal from a reset signal terminal to the light-emitting device in response to the first gate signal, so as to reset the light-emitting device.

6. The pixel circuit according to claim 5, wherein the second reset sub-circuit includes:
   a sixth transistor, a gate of the sixth transistor being electrically connected to the first gate signal terminal, a first electrode of the sixth transistor being electrically connected to the reset signal terminal, and a second electrode of the sixth transistor being electrically connected to the light-emitting device.

7. The pixel circuit according to claim 1, wherein the driving sub-circuit includes:
   a driving transistor, a first electrode of the driving transistor being electrically connected to the data writing sub-circuit and the light-emitting control sub-circuit, and a second electrode of the driving transistor being electrically connected to the light-emitting control sub-circuit; and
   a first capacitor, a first, terminal of the first capacitor being electrically connected to the first power supply voltage terminal, and a second terminal of the first capacitor being electrically connected to a gate of the driving transistor and the data writing sub-circuit.

8. The pixel circuit according to claim 1, further comprising:
   a first reset sub-circuit electrically connected to the data writing sub-circuit, the first reset sub-circuit being configured to transmit a reset voltage signal from a reset signal terminal to the driving sub-circuit through the data writing sub-circuit, in response to the second enable signal or a third gate signal from a third gate signal terminal, so as to reset the driving sub-circuit; and a second reset sub-circuit electrically connected to the light-emitting device, the second reset sub-circuit being configured to transmit the reset voltage signal from the reset signal terminal to the light-emitting device in response to the first gate signal, so as to reset the light-emitting device; wherein the data writing sub-circuit includes a first transistor, a second transistor, a third transistor and a fourth transistor, the first reset sub-circuit includes a fifth transistor, the second reset sub-circuit including a sixth transistor, the light-emitting control sub-circuit includes a seventh transistor and an eighth transistor, and the driving sub-circuit includes a driving transistor and a first capacitor, wherein a gate of the first transistor is electrically connected to the second gate signal terminal, a first electrode of the first transistor is electrically connected to the data voltage signal terminal, and a second electrode of the first transistor is electrically connected to a first electrode of the second transistor;

a gate of the second transistor is electrically connected to the first gate signal terminal, and a second electrode of the second transistor is electrically connected to a first electrode of the driving transistor;

a gate of the third transistor is electrically connected to the second gate signal terminal, a first electrode of the third transistor is electrically connected to a second electrode of the driving transistor, and a second electrode of the third transistor is electrically connected to a first electrode of the fourth transistor;

a gate of the fourth transistor is electrically connected to the first gate signal terminal, a first electrode of the fourth transistor is further electrically connected to a second electrode of the fifth transistor, and a second electrode of the fourth transistor is electrically connected to a gate of the driving transistor and a second terminal of the first capacitor;

the gate of the driving transistor is further electrically connected to the second terminal of the first capacitor, the first electrode of the driving transistor is further electrically connected to a second electrode of the seventh transistor, and the second terminal of the driving transistor is further electrically connected to a first electrode of the eighth transistor;

a first terminal of the first capacitor is electrically connected to the first power supply voltage terminal;

a gate of the fifth transistor is electrically connected to the second enable signal terminal or the third gate signal terminal, and a first electrode of the fifth transistor is electrically connected to the reset signal terminal;

a gate of the sixth transistor is electrically connected to the first gate signal terminal, a first electrode of the sixth transistor is electrically connected to the reset signal terminal, and a second electrode of the sixth transistor is electrically connected to the light-emitting device;

a gate of the seventh transistor is electrically connected to the second enable signal terminal, and a first electrode of the seventh transistor is electrically connected to the first power supply voltage terminal; and a gate of the eighth transistor is electrically connected to the first enable signal terminal, and a second electrode of the eighth transistor is electrically connected to the light-emitting device.

9. A display panel having a sub-pixel array, the sub-pixel array including a plurality of sub-pixels arranged in an array; the display panel comprising: a plurality of pixel circuits according to claim 1, each pixel circuit being disposed in a respective one of the plurality of sub-pixels; and at least one gate driver circuit, the first direction being substantially parallel to a column direction of the sub-pixel array, each gate driver circuit being electrically connected to a plurality of sub-pixel rows in the sub-pixel array, and each shift register in the gate driver circuit being electrically connected to a corresponding sub-pixel row of the plurality of sub-pixel rows, wherein a pixel circuit of each sub-pixel in the corresponding sub-pixel row is configured to:

receive a first output signal output by a first shift register corresponding to the corresponding sub-pixel row as a first gate signal, and a second output signal output thereby as a first enable signal; and receive a third output signal output by a second shift register corresponding to a next sub-pixel row of the corresponding sub-pixel row as a second gate signal, and a fourth output signal output thereby as a second enable signal; or receive a third output signal output by a second shift register corresponding to the corresponding sub-pixel row as the first gate signal, and a fourth output signal output thereby as the first enable signal; and receive a first output signal output by a first shift register corresponding to a next sub-pixel row of the corresponding sub-pixel row as the second gate signal, and a second output signal output thereby as the second enable signal;

wherein the gate driver circuit includes a first cascade group and a second cascade group, wherein the first cascade group includes a plurality of first shift registers connected in cascade, and the second cascade group includes a plurality of second shift registers connected in cascade; the plurality of first shift registers and the plurality of second shift registers being alternately arranged in a first direction, and each shift register including a first output terminal and a second output terminal;

wherein each first shift register is configured to: output a first output signal through a first output terminal thereof and a second output signal through a second output terminal thereof, in response to a first clock signal and a second clock signal; and each second shift register is configured to output a third output signal through a first output terminal thereof and a fourth output signal through a second output terminal thereof, in response to a third clock signal and a fourth clock signal; phases of the first clock signal and the second clock signal are opposite, and phases of the third clock signal and the fourth clock signal are opposite; phases of the first output signal and the second output signal are opposite, and phases of the third output signal and the fourth output signal are opposite.

10. The display panel according to claim 9, wherein the pixel circuit further includes: a first reset sub-circuit, the first reset sub-circuit is electrically connected to a corresponding data writing sub-circuit; the first reset sub-circuit is configured to: transmit a reset voltage signal from a reset signal terminal to a corresponding driving sub-circuit through the corresponding data writing sub-circuit, in response to a third gate signal from a corresponding third gate signal terminal, so as to reset the corresponding driving sub-circuit; the pixel circuit is further configured to: receive a third output signal output by a second shift register corresponding to a previous sub-pixel row of the corresponding sub-pixel row as the third gate signal; or receive a first output signal output by a first shift register corresponding to the previous sub-pixel row of the corresponding sub-pixel row as the third gate signal.

11. The display panel according to claim 9, wherein the first output signal and the third output signal have a phase difference therebetween, the first output signal has a first level period and a second level period in sequence within one cycle, and a duration corresponding to the phase difference is less than a duration of the first level period.

12. The display panel according to claim 9, wherein each shift register further includes an input terminal, a first clock signal receiving terminal and a second clock signal receiving terminal; each of at least one shift register of the plurality of first shift registers and the plurality of second shift registers further includes:
 a first output sub-circuit, the first output sub-circuit being electrically connected to a third power supply voltage terminal, a fourth power supply voltage terminal, a corresponding input terminal, a corresponding first clock signal receiving terminal, a corresponding second clock signal receiving terminal, a corresponding first output terminal, and a corresponding second output terminal; the first output sub-circuit including an eleventh transistor to a seventeenth transistor, a second capacitor and a third capacitor; wherein
 a gate of the eleventh transistor is electrically connected to the corresponding first clock signal receiving terminal, a first electrode of the eleventh transistor is electrically, connected to the corresponding input terminal, and a second electrode of the eleventh transistor is electrically connected to a gate of the twelfth transistor, a gate of the fifteenth transistor, and a first terminal of the second capacitor;
 a first electrode of the twelfth transistor is electrically connected to the corresponding first clock signal receiving terminal, and a second electrode of the twelfth transistor is electrically connected to the corresponding second output terminal, a gate of the sixteenth transistor, a gate of the fourteenth transistor, and a first terminal of the third capacitor;
 a gate of the thirteenth transistor is electrically connected to the corresponding first clock signal receiving terminal, a first electrode of the thirteenth transistor is electrically connected to the fourth power supply voltage terminal, and a second electrode of the thirteenth transistor is electrically connected to the corresponding second output terminal, the gate of the sixteenth transistor, the gate of the fourteenth transistor, and the first terminal of the third capacitor;
 the gate of the fourteenth transistor is further electrically connected to the first terminal of the third capacitor, a first electrode of the fourteenth transistor is electrically connected to the third power supply voltage terminal, and a second electrode of the fourteenth transistor is electrically connected to a second terminal of the second capacitor, and the corresponding first output terminal;
 the gate of the fifteenth transistor is further electrically connected to the first terminal of the second capacitor and a second electrode of the seventeenth transistor, a first electrode of the fifteenth transistor is electrically connected to the corresponding second clock signal receiving terminal, and a second electrode of the fifteenth transistor is electrically connected to the second terminal of the second capacitor, and the corresponding first output terminal;
 the gate of the sixteenth transistor is further electrically connected to the first terminal of the third capacitor, a first electrode of the sixteenth transistor is electrically connected to the third power supply voltage terminal, and a second electrode of the sixteenth transistor is electrically connected to a first electrode of the seventeenth transistor;
 a gate of the seventeenth transistor is electrically connected to the corresponding second clock signal receiving terminal, and the second electrode of the seventeenth transistor is further electrically connected to the first terminal of the second capacitor;
 the second terminal of the second capacitor is further electrically connected to the corresponding first output terminal; and
 a second terminal of the third capacitor is electrically connected to the third power supply voltage terminal.

13. The display panel according to claim 9, wherein each shift register further includes an input terminal, a first clock signal receiving terminal and a second clock signal receiving terminal; each of at least one shift register of the plurality of first shift registers and the plurality of second shift registers further includes:
 a first output sub-circuit, the first output sub-circuit being electrically connected to a third power supply voltage terminal, a fourth power supply voltage terminal, a corresponding input terminal, a corresponding first clock signal receiving terminal, a corresponding second clock signal receiving terminal, and a corresponding first output terminal; and the first output sub-circuit including an eleventh transistor to a seventeenth transistor, a second capacitor and a third capacitor; and
 a second output sub-circuit electrically connected to the first output sub-circuit, the second output sub-circuit being further electrically connected to the third power supply voltage terminal, the fourth power supply voltage terminal, the corresponding first clock signal receiving terminal, the corresponding second clock signal receiving terminal, and a corresponding second output terminal; and the second output sub-circuit including an eighteenth transistor to a twenty-first transistor and a fourth capacitor; wherein
 a gate of the eleventh transistor is electrically connected to the corresponding first clock signal receiving terminal, a first electrode of the eleventh transistor is electrically connected to the corresponding input terminal, and a second electrode of the eleventh transistor is electrically connected to a gate of the twelfth transistor, a gate of the fifteenth transistor, and a first terminal of the second capacitor;
 a first electrode of the twelfth transistor is electrically connected to the corresponding first clock signal receiving terminal, and a second electrode of the twelfth transistor is electrically connected to a gate of the sixteenth transistor, a gate of the fourteenth transistor, and a first terminal of the third capacitor;

a gate of the thirteenth transistor is electrically connected to the corresponding first clock signal receiving terminal, a first electrode of the thirteenth transistor is electrically connected to the fourth power supply voltage terminal, and a second electrode of the thirteenth transistor is electrically connected to the gate of the sixteenth transistor, the gate of the fourteenth transistor, and the first terminal of the third capacitor;

the gate of the fourteenth transistor is electrically connected to the first terminal of the third capacitor, a first electrode of the fourteenth transistor is electrically connected to the third power supply voltage terminal, and a second electrode of the fourteenth transistor is electrically connected to a second terminal of the second capacitor, the corresponding first output terminal, a gate of the eighteenth transistor, and a gate of the twentieth transistor;

the gate of the fifteenth transistor is further electrically connected to the first terminal of the second capacitor and a second electrode of the seventeenth transistor, a first electrode of the fifteenth transistor is electrically connected to the corresponding second clock signal receiving terminal, and a second electrode of the fifteenth transistor is electrically connected to the second terminal of the second capacitor, the corresponding first output terminal, the gate of the eighteenth transistor, and the gate of the twentieth transistor;

the gate of the sixteenth transistor is further electrically connected to the first terminal of the third capacitor, a first electrode of the sixteenth transistor is electrically connected to the third power supply voltage terminal, and a second electrode of the sixteenth transistor is electrically connected to a first electrode of the seventeenth transistor;

a gate of the seventeenth transistor is electrically connected to the corresponding second clock signal receiving terminal, and the second electrode of the seventeenth transistor is further electrically connected to the first terminal of the second capacitor;

a first electrode of the eighteenth transistor is electrically connected to the third power supply voltage terminal, and a second electrode of the eighteenth transistor is electrically connected to a gate of the twenty-first transistor and a first terminal of the fourth capacitor;

a gate of the nineteenth transistor is electrically connected to the first clock signal receiving terminal, a first electrode of the nineteenth transistor is electrically connected to the fourth power supply voltage terminal, and a second electrode of the nineteenth transistor is electrically connected to the gate of the twenty-first transistor and the first terminal of the fourth capacitor;

a first electrode of the twentieth transistor is electrically connected to the third power supply voltage terminal, and a second electrode of the twentieth transistor is electrically connected to the corresponding second output terminal;

the gate of the twenty-first transistor is further electrically connected to the first terminal of the fourth capacitor, a first electrode of the twenty-first transistor is electrically connected to the fourth power supply voltage terminal, and a second electrode of the twenty-first transistor is electrically connected to the second corresponding output terminal; and a second terminal of the fourth capacitor is electrically connected to the second clock signal receiving terminal.

14. A driving method of the pixel circuit according to claim 1, each pixel circuit having a second phase and a third phase in an image frame, the driving method comprising:

in the second phase, writing, by the data writing sub-circuit, the data voltage signal from the data voltage terminal into the driving sub-circuit, and compensating, by the data writing sub-circuit, the data voltage signal, in response to the first gate signal and the second gate signal; and in the third phase, closing, by the light-emitting control sub-circuit, the line between the first power supply voltage terminal and the second power supply voltage terminal, in response to the first enable signal and the second enable signal, and providing, by the driving sub-circuit, the driving current to the light-emitting device through the closed line between the first power supply voltage terminal and the second power supply voltage terminal according to the written data voltage signal; wherein the phases of the first enable signal and the first gate signal are opposite, and the phases of the second gate signal and the second enable signal are opposite.

15. The driving method according to claim 14, wherein the first enable signal and the second enable signal have a phase difference therebetween, the first enable signal has a third level period and a fourth level period in sequence within one cycle, and a duration corresponding to the phase difference is less than a duration of the third level period of the first enable signal.

16. The driving method according to claim 14, wherein the pixel circuit further includes a first reset sub-circuit electrically connected to the data writing sub-circuit; the image frame further includes a first phase before the second phase, the driving method further comprises:

in the first phase, transmitting; by the first reset sub-circuit, a reset voltage signal from a reset signal terminal to the driving sub-circuit through the data writing sub-circuit, in response to the second enable signal or a third gate signal from a third gate signal terminal, so as to reset the driving sub-circuit.

17. The driving method according to claim 14, wherein the pixel circuit further includes a second reset sub-circuit electrically connected to the light-emitting device; the image frame further includes a first phase before the second phase, the driving method further comprises:

in the first phase, transmitting, by the second reset sub-circuit, a reset voltage signal from a reset signal terminal to the light-emitting device, in response to the first gate signal, so as to reset the light-emitting device.

* * * * *